US007820551B2

(12) United States Patent
Yagishita et al.

(10) Patent No.: US 7,820,551 B2
(45) Date of Patent: Oct. 26, 2010

(54) SEMICONDUCTOR DEVICE HAVING FINS FET AND MANUFACTURING METHOD THEREOF

(75) Inventors: Atsushi Yagishita, Somers, NY (US); Akio Kaneko, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 11/972,097

(22) Filed: Jan. 10, 2008

(65) Prior Publication Data

US 2008/0191271 A1  Aug. 14, 2008

(30) Foreign Application Priority Data

Jan. 12, 2007 (JP) ............... 2007-004672

(51) Int. Cl.
*H01L 21/311* (2006.01)
(52) U.S. Cl. .............. 438/700; 438/197; 438/770; 438/311; 257/E21.17; 257/E21.32; 257/E21.051; 257/E21.058; 257/E21.077; 257/E21.218; 257/E21.277; 257/E21.229; 257/E21.267; 257/E21.304; 257/E21.319; 257/E21.421
(58) Field of Classification Search .............. 438/700, 438/197, 311, 692, 706, 712, 752, 769, 770, 438/775; 257/E21.32, E21.051, E21.058, 257/E21.077, E21.218, E21.227, E21.229, 257/E21.267, E21.304, E21.319, E21.421
See application file for complete search history.

(56) References Cited

U.S. PATENT DOCUMENTS

| 7,326,619 | B2 * | 2/2008 | Park et al. | 438/282 |
| 7,393,733 | B2 * | 7/2008 | Currie | 438/164 |
| 7,488,650 | B2 * | 2/2009 | Schulz | 438/268 |
| 2006/0275988 | A1 | 12/2006 | Yagishita et al. | |

FOREIGN PATENT DOCUMENTS

JP   2005-229107   8/2005

* cited by examiner

*Primary Examiner*—David Nhu
(74) *Attorney, Agent, or Firm*—Finnegan, Henderson, Farabow, Garrett & Dunner, L.L.P.

(57) ABSTRACT

A line-form insulator is formed on a substrate and then the substrate is etched with the insulator used as a mask to form first trenches on both sides of the insulator. Side wall insulators are formed on the side walls of the first trenches, the substrate is etched with the insulator and side wall insulators used as a mask to form second trenches in the bottom of the first trenches. After, the substrate is oxidized with the insulator and side wall insulators used as an anti-oxidation mask to cause oxide regions formed on the adjacent side walls of the second trenches lying on both sides of the substrate to make contact with each other and the insulator and side wall insulators are removed. Then, a fin FET having a semiconductor region as a line-form fin is formed in the substrate.

11 Claims, 26 Drawing Sheets

Nano wire-fin FET

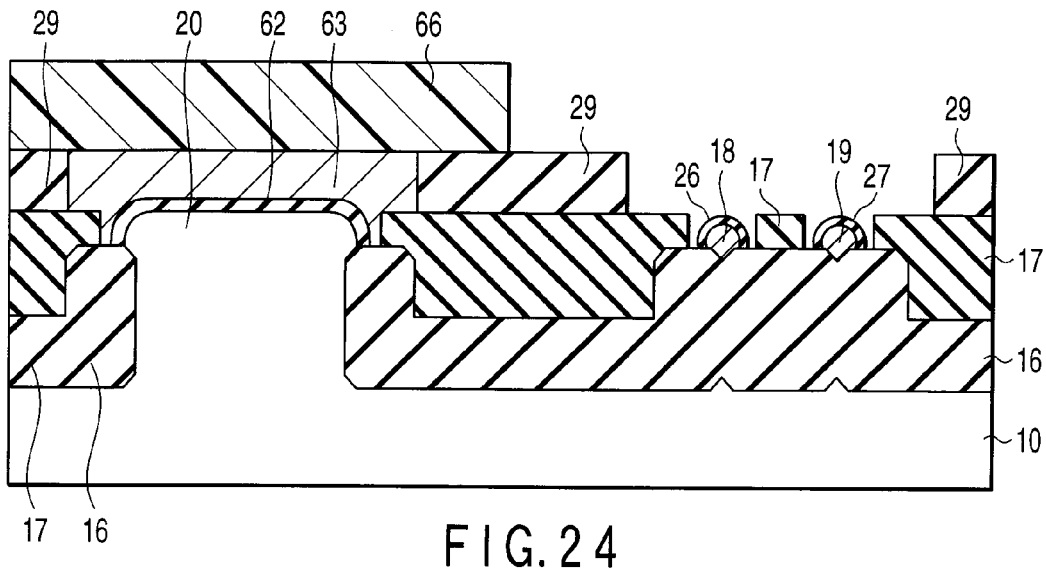
F I G. 2 4
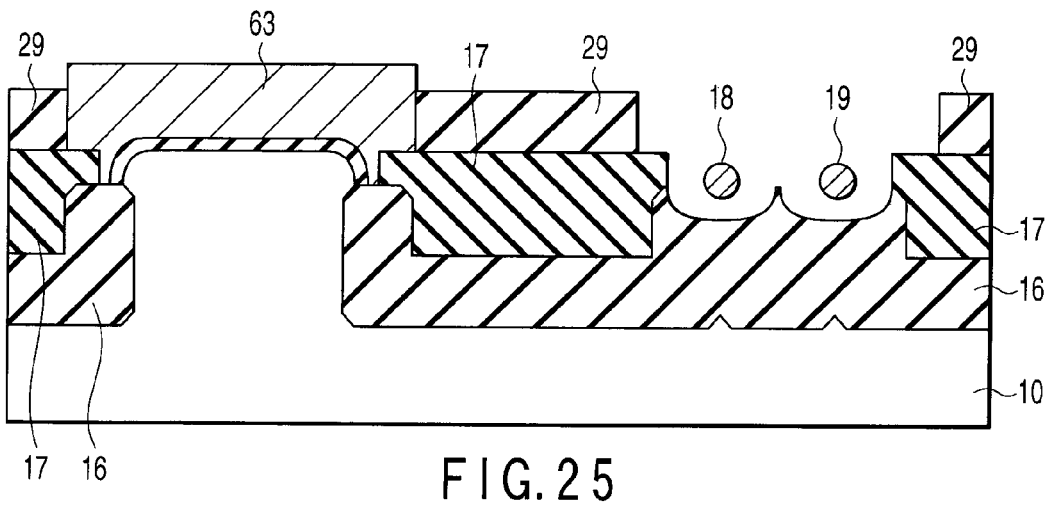
F I G. 2 5
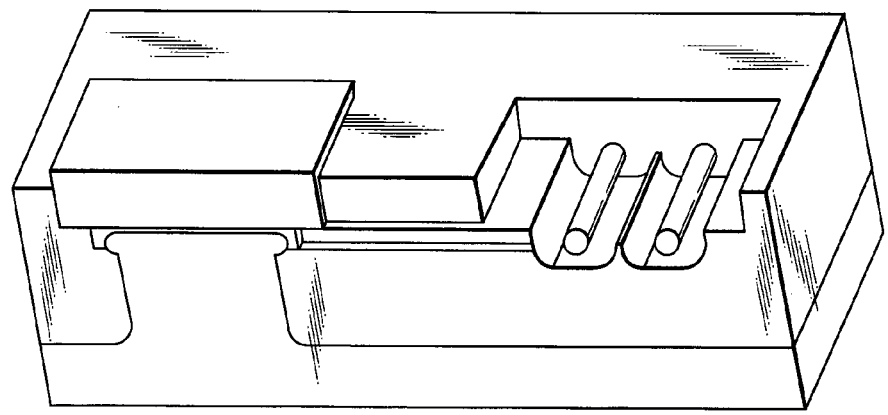
F I G. 2 6

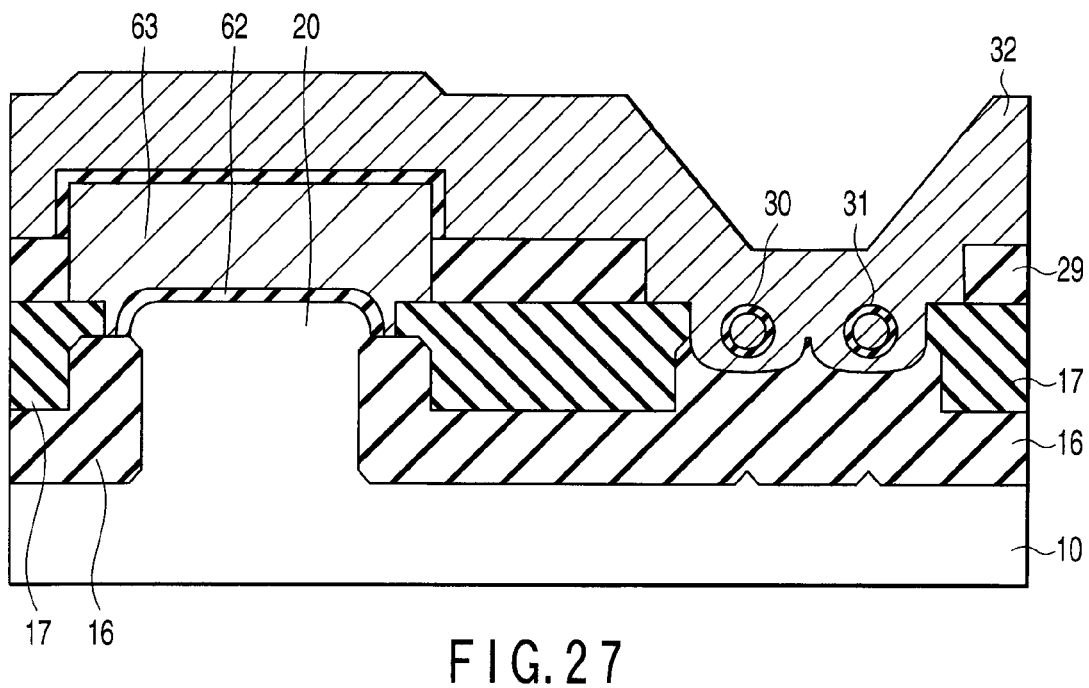
F I G. 27
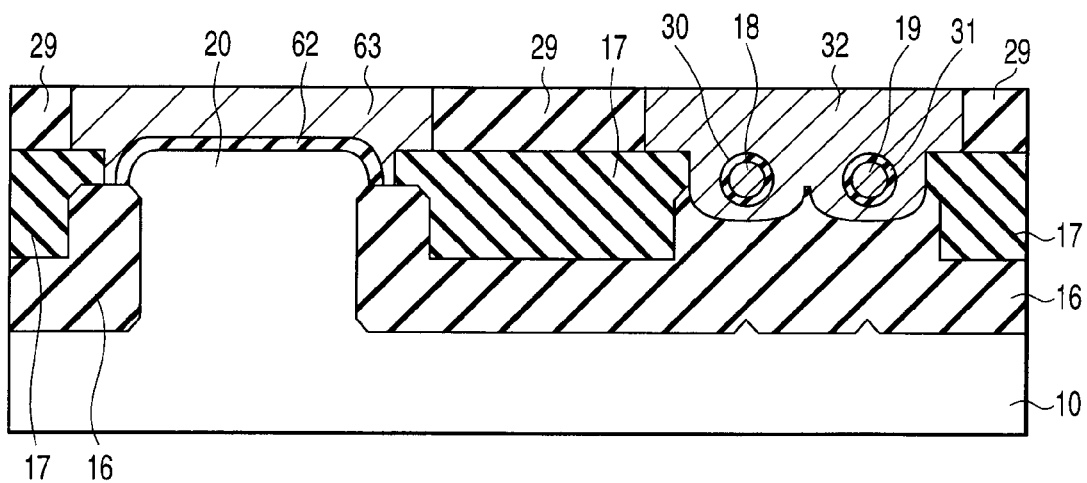
F I G. 28

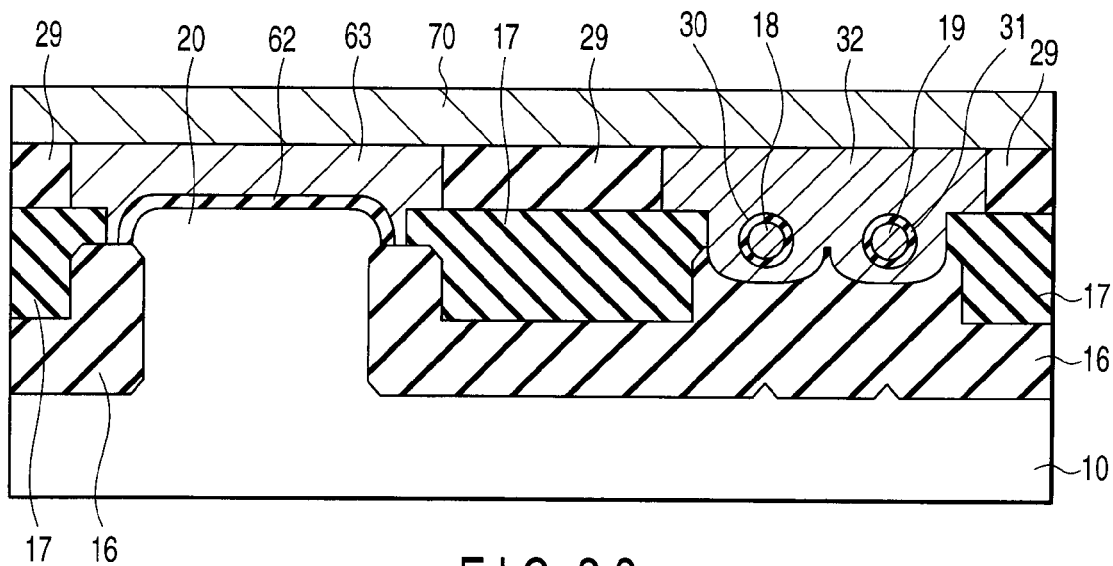
F I G. 29
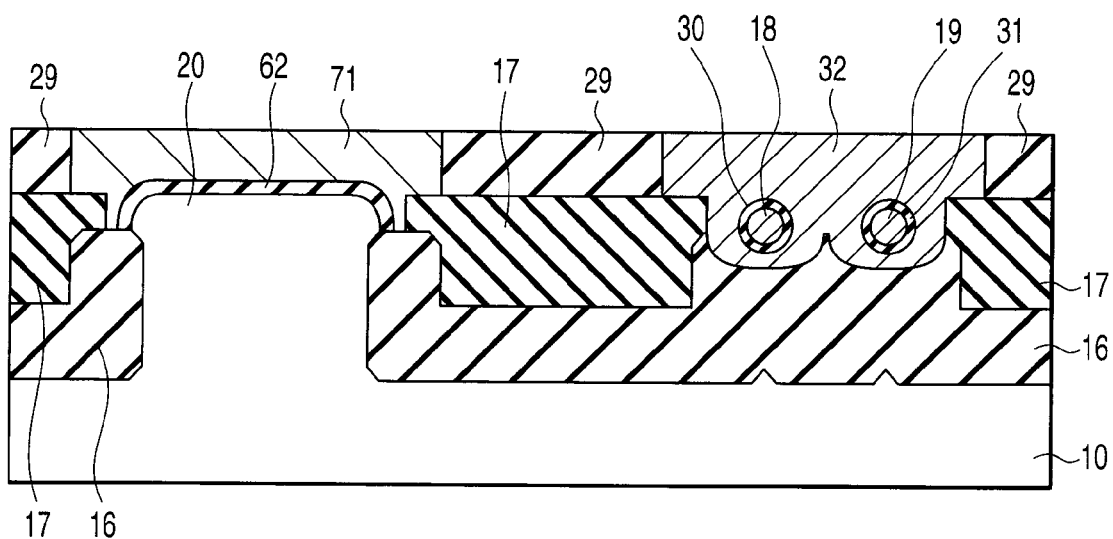
F I G. 30

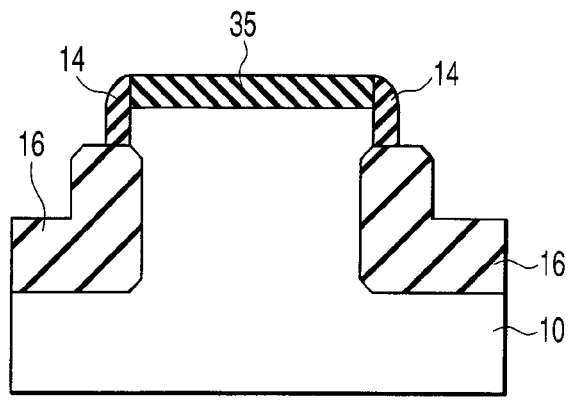 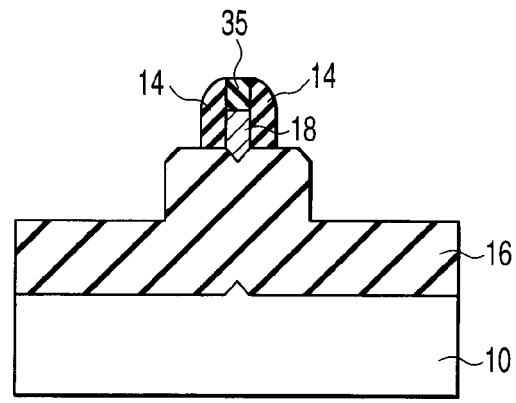
FIG.49A  FIG.49B
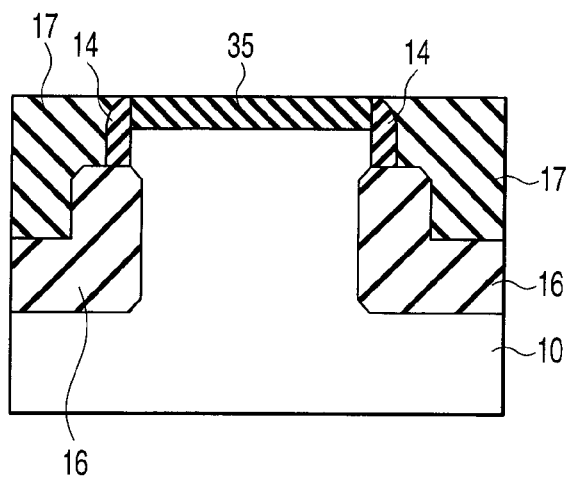 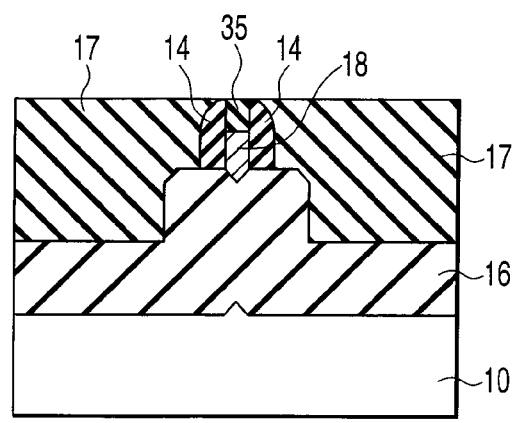
FIG.50A  FIG.50B

SEMICONDUCTOR DEVICE HAVING FINS FET AND MANUFACTURING METHOD THEREOF

CROSS-REFERENCE TO RELATED APPLICATIONS

This application is based upon and claims the benefit of priority from prior Japanese Patent Application No. 2007-004672, filed Jan. 12, 2007, the entire contents of which are incorporated herein by reference.

BACKGROUND OF THE INVENTION

1. Field of the Invention

This invention relates to a semiconductor device having fin FETs (Field Effect Transistors) and a manufacturing method thereof.

2. Description of the Related Art

Fin FETs, particularly, fin FETs formed on a bulk Si substrate are devices which are low in cost and excellent in the cut-off characteristic and are regarded as favorable next-generation transistor structures (for example, refer to Jpn. Pat. Appln. KOKAI Publication No. 2005-229107).

However, in order to attain the multiple threshold voltages and cope with analog devices, since the planar device is simple in structure and low in cost, it is necessary to mount the conventional planar MOSFETs and fin FETs together on the actual LSI. Therefore, a simple manufacturing process for mounting both of the FETs together is required.

If planar MOSFETs and fin FETs are mounted together on one chip, the surfaces of the gates become irregular and there occurs a problem that it becomes difficult to perform the lithography process for formation of minute gates and it becomes impossible to simultaneously process the gates of the fin region and planar region. Further, there occurs a problem that the number of manufacturing steps increases and the manufacturing cost rises.

BRIEF SUMMARY OF THE INVENTION

According to a first aspect of the present invention, there is provided a manufacturing method of a semiconductor device which includes forming a line-form insulating film on the main surface of a semiconductor substrate, etching the semiconductor substrate with the line-form insulating film used as a mask to form two adjacent first trenches on both sides of the line-form insulating film, forming side wall insulating films on the side walls of the adjacent first trenches, etching the semiconductor substrate with the line-form insulating film and side wall insulating films used as a mask to form second trenches in the bottom portions of the adjacent first trenches, oxidizing the semiconductor substrate with the line-form insulating film and side wall insulating films used as an anti-oxidation mask to cause oxide regions formed on adjacent side walls of the second trenches lying on both sides of the semiconductor substrate to make contact with each other, removing the line-form insulating film and side wall insulating films, forming a gate insulating film on the surface of a semiconductor region of the semiconductor substrate which is exposed by removing the above films, forming a gate electrode on the gate insulating film, and forming a fin field effect transistor having the semiconductor region as a line-form fin.

According to a second aspect of the present invention, there is provided a manufacturing method of a semiconductor device which includes simultaneously forming a line-form first insulating film and a second insulating film having larger line width than the first insulating film on the main surface of a semiconductor substrate, etching the semiconductor substrate with the first and second insulating films used as a mask to form a plurality of first trenches on both sides of the first and second insulating films, forming side wall insulating films on the side walls of the plurality of first trenches, etching the semiconductor substrate with the first and second insulating films and side wall insulating films used as a mask to form second trenches in the bottom portions of the plurality of first trenches, oxidizing the semiconductor substrate with the first and second insulating films and side wall insulating films used as an anti-oxidation mask to cause oxide regions formed on adjacent side walls of the second trenches which lie on both sides of the first insulating film and sandwich the semiconductor substrate to make contact with each other and prevent oxide regions formed on adjacent side walls of the second trenches which lie on both sides of the second insulating film and sandwich the semiconductor substrate from making contact with each other, removing the first and second insulating films and side wall insulating films, forming a gate insulating film on the surface of a semiconductor region of the semiconductor substrate which is exposed by removing the first insulating film and forming a gate electrode on the gate insulating film to form a fin field effect transistor having the semiconductor region as a line-form fin, and forming one of a planar field effect transistor and planar region on a different semiconductor region of the semiconductor substrate which is exposed by removing the second insulating film.

According to a third aspect of the present invention, there is provided a semiconductor device which includes a silicon oxide film formed on a bulk silicon substrate, a line-form fin formed on the silicon oxide film, and planar regions which are parts of the substrate and connected to both ends of the fin in the extending direction, the width thereof in a direction perpendicular to the extending direction being larger than that of the fin and the height of the upper surface thereof being set equal to the height of the upper surface of the fin.

BRIEF DESCRIPTION OF THE SEVERAL VIEWS OF THE DRAWING

FIG. 24 is a cross sectional view showing one step of a manufacturing method of a semiconductor device according to a first modification of the second embodiment of this invention;

FIG. 25 is a cross sectional view showing one step of the manufacturing method of the semiconductor device following the step of FIG. 24;

FIG. 26 is a perspective view corresponding to the cross sectional view of FIG. 25;

FIG. 27 is a cross sectional view showing one step of the manufacturing method of the semiconductor device following the step of FIG. 26;

FIG. 28 is a cross sectional view showing one step of the manufacturing method of the semiconductor device following the step of FIG. 27;

FIG. 29 is a cross sectional view showing one step of a manufacturing method of a semiconductor device according to a second modification of the second embodiment of this invention;

FIG. 30 is a cross sectional view showing one step of the manufacturing method of the semiconductor device following the step of FIG. 29;

FIG. 49A is a cross sectional view taken along the B-B' line and showing one step of the manufacturing method of the semiconductor device following the step of FIG. 48A;

FIG. 49B is a cross sectional view taken along the A-A' line and showing one step of the manufacturing method of the semiconductor device following the step of FIG. 48B;

FIG. 50A is a cross sectional view taken along the B-B' line and showing one step of the manufacturing method of the semiconductor device following the step of FIG. 49A;

FIG. 50B is a cross sectional view taken along the A-A' line and showing one step of the manufacturing method of the semiconductor device following the step of FIG. 49B;

DETAILED DESCRIPTION OF THE INVENTION

Figure 1:
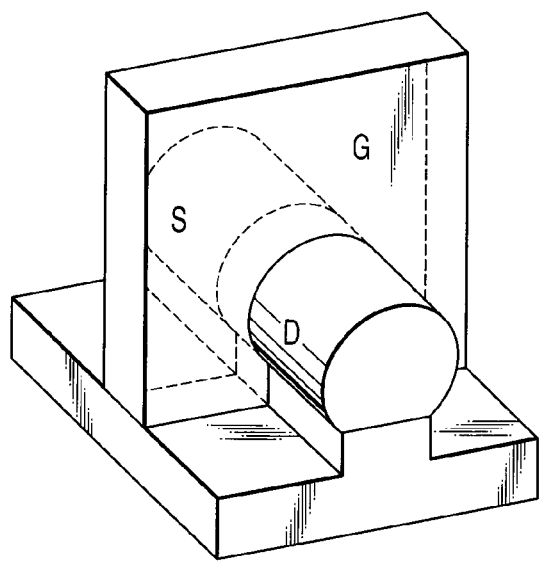
FIG. 1 is a perspective view showing the 3-dimensional structure of a nano wire-fin FET according to one embodiment of this invention.

FIG. 1 is a perspective view showing the 3-dimensional structure of a nano wire-fin FET according to one embodiment of this invention. A MOS (Metal Oxide Semiconductor) FET in which the aspect ratio of a fin (the height of the fin/the width of the fin) is reduced to approximately "1" by lowering the height of the fin whose width is 10 nm or less is generally called a nano wire-fin FET and not only the side walls thereof but also the upper surface thereof is generally used as a channel surface. Particularly, if not only the side surfaces of the fin but also the upper surface and bottom surface are used as the channel, the FET is called a gate-all-around nano wire-fin FET.

As the merit of the nano wire-fin FET, the merits that (1) the FET has higher resistance against the short channel effect in comparison with the normal fin FET and can be made smaller accordingly, (2) the mobility is enhanced as the result of a reduction in the scattering probability and effective mass by quantum confinement and (3) the fluctuation in the threshold voltage caused by a variation in the impurity concentration is reduced and the like can be provided.

First Embodiment

The manufacturing method of a semiconductor device according to a first embodiment of this invention is explained below with reference to FIGS. 2 to 14 which are cross sectional views of the semiconductor device in the respective manufacturing steps.

In the present embodiment, the nano wire-fin FET shown in FIG. 1 is formed on the same substrate on which a planar MOSFET is formed.

Figure 2:
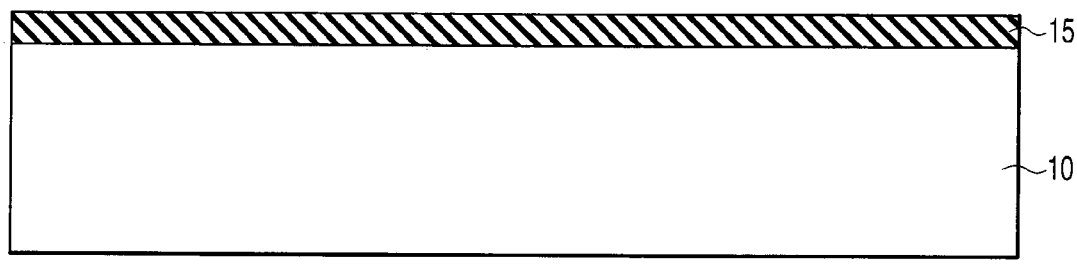
FIG. 2 is a cross sectional view showing one step of a manufacturing method of a semiconductor device according to a first embodiment of this invention.

First as shown in FIG. 2, a hard mask member 15 formed of SiN with the film thickness of approximately 50 nm is deposited on a bulk Si substrate 10 with a thin oxide film (not shown) of approximately 2 nm thickness disposed therebetween. As the hard mask member 15, an insulating film of $SiO_2$ or SiON, a laminated film of $SiN/SiO_2/SiN$ or another insulating film can be used.

Figure 3:
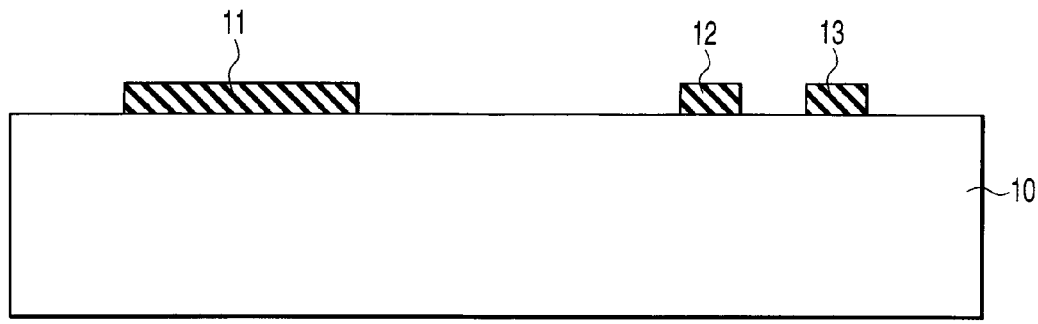
FIG. 3 is a cross sectional view showing one step of the manufacturing method of the semiconductor device following the step of FIG. 2.

Next, as shown in FIG. 3, active (channel) regions of the planar MOSFET and nano wire-fin FET are patterned to form a hard mask 11 and hard masks 12, 13 corresponding to the respective active regions. The line width of the line-form hard masks 12, 13 used to form the nano wire-fin FET having fins with the width of approximately 10 nm or less is set smaller than the line width of the hard mask 11 to form the planar MOSFET.

Figure 4:
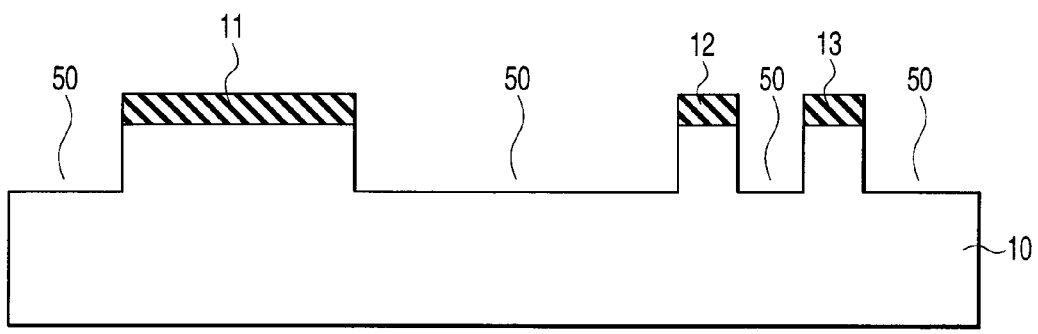
FIG. 4 is a cross sectional view showing one step of the manufacturing method of the semiconductor device following the step of FIG. 3.

After this, the RIE (reactive ion etching) process is performed with the hard masks 11, 12, 13 used as a mask to form first trenches 50 with the depth of approximately 20 nm in the bulk Si substrate 10 as shown in FIG. 4.

Figure 5:
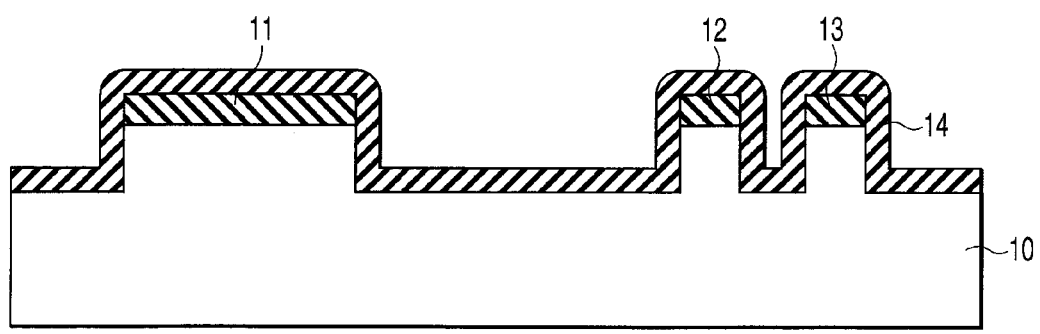
FIG. 5 is a cross sectional view showing one step of the manufacturing method of the semiconductor device following the step of FIG. 4.
Figure 6:
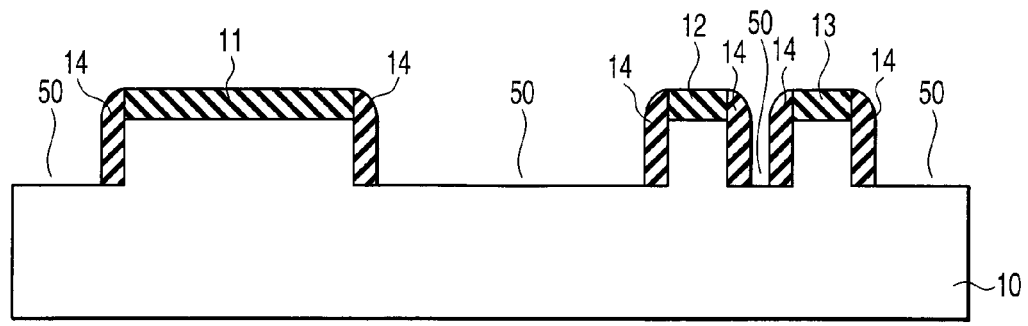
FIG. 6 is a cross sectional view showing one step of the manufacturing method of the semiconductor device following the step of FIG. 5.

Next, an SiN film 14 is formed on the entire surface of the resultant semiconductor structure as shown in FIG. 5, as shown in FIG. 5 and then the resultant semiconductor structure is etched back as shown in FIG. 6 to form side wall insulating films 14 with the thickness of approximately 20 nm on the side surfaces of the first trenches 50. As the side wall insulating film 14, an insulating film of $SiO_2$ or SiON or another insulating film can be used.

Figure 7:
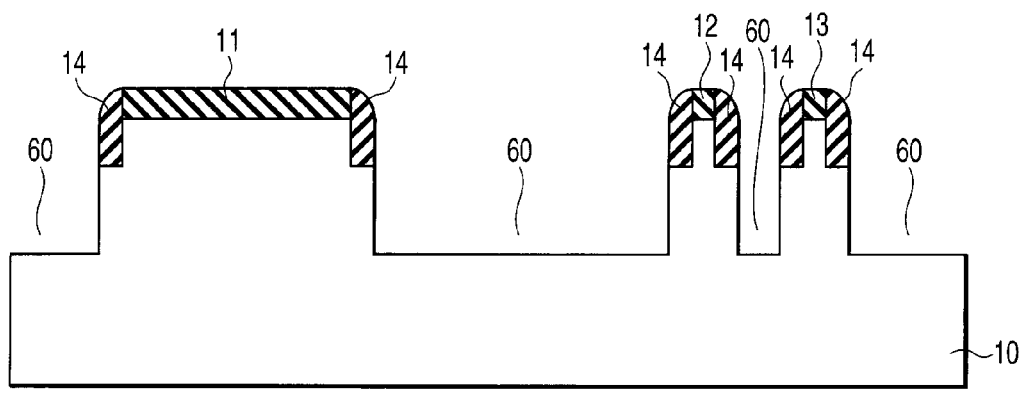
FIG. 7 is a cross sectional view showing one step of the manufacturing method of the semiconductor device following the step of FIG. 6.

After this, as shown in FIG. 7, the Si substrate 10 is etched with the hard masks 11, 12, 13 and side wall insulating films 14 used as a mask to further dig the bottom portions of the first trenches 50 and form second trenches 60.

Figure 8:
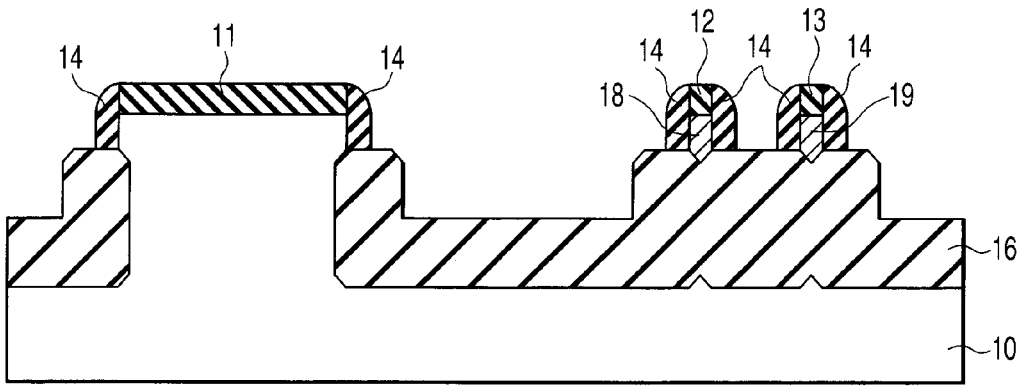
FIG. 8 is a cross sectional view showing one step of the manufacturing method of the semiconductor device following the step of FIG. 7.

Next, as shown in FIG. 8, the surface portions of the Si substrate 10 which are exposed to the bottom portions of the second trenches 60 are oxidized to form oxide films 16 with the hard masks 11, 12, 13 and side wall insulating films 14 used as an anti-oxidation mask. At this time, the oxide film thickness is adjusted so that the oxide films 16 extending from the side walls of the second trenches 60 on both sides of a portion which lies under regions used as the fins and lying under the hard masks 12, 13 will come into contact with each other.

As a result, the structure in which fin regions 18, 19 which are semiconductor regions are left behind on the oxide film 16, that is, the SOI (Silicon On Insulator) structure is formed partially in a fin FET region. On the other hand, since the oxide films extending from the side walls of the second trench 60 do not come into contact with each other in a planar MOSFET region in which the channel width of a portion under the hard mask 11 is made larger, the SOI structure cannot be obtained.

Figure 9:
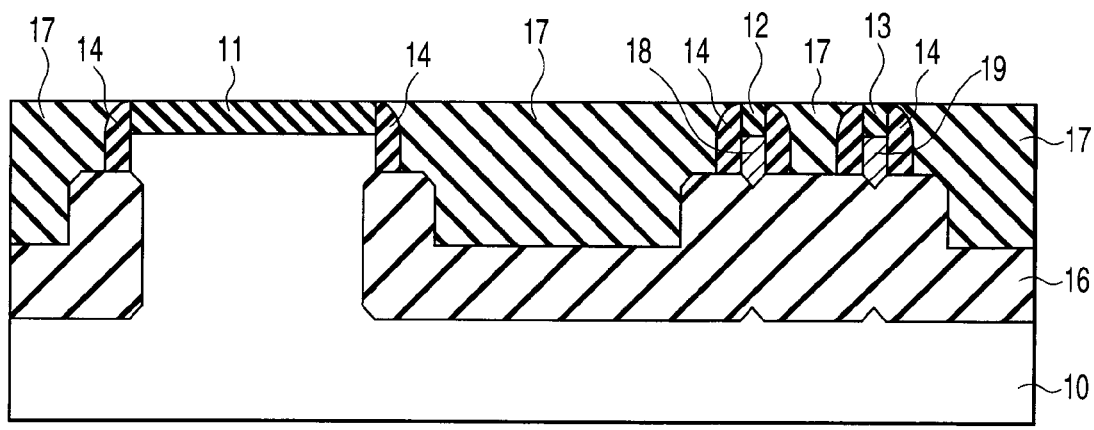
FIG. 9 is a cross sectional view showing one step of the manufacturing method of the semiconductor device following the step of FIG. 8.

Next, as shown in FIG. 9, an element isolation insulating film (STI: Shallow Trench Isolation) 17 formed of an $SiO_2$-series insulating film is deposited on the entire surface by use of HDP (High Density Plasma) or the like and then the resultant semiconductor structure is made flat by use of a CMP (Chemical Mechanical Polishing) process to expose the SiN hard masks 11, 12, 13.

Figure 10:
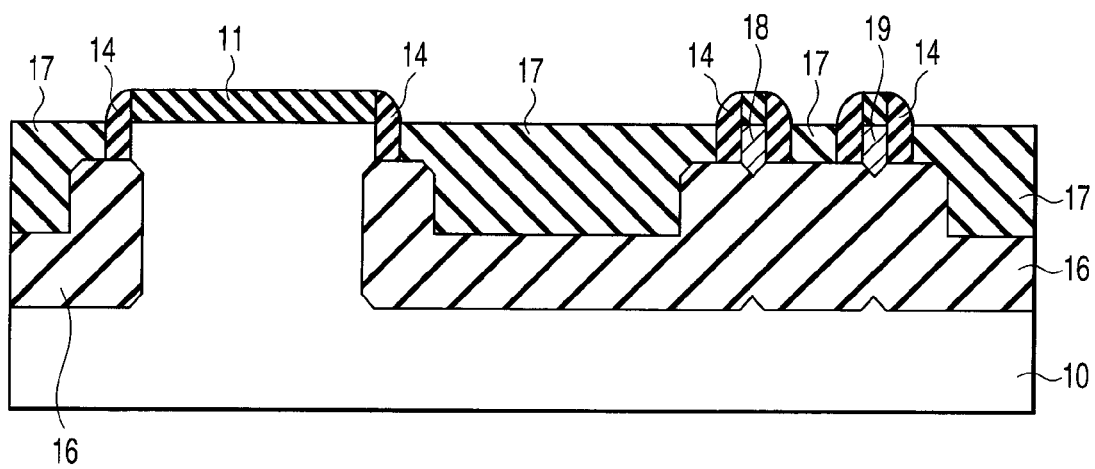
FIG. 10 is a cross sectional view showing one step of the manufacturing method of the semiconductor device following the step of FIG. 9.

Further, as shown in FIG. 10, the height of the surface of the element isolation insulating film (STI) 17 is set equal to the height of the surfaces of the fin regions 18, 19 by etching the element isolation insulating film 17.

Figure 11:
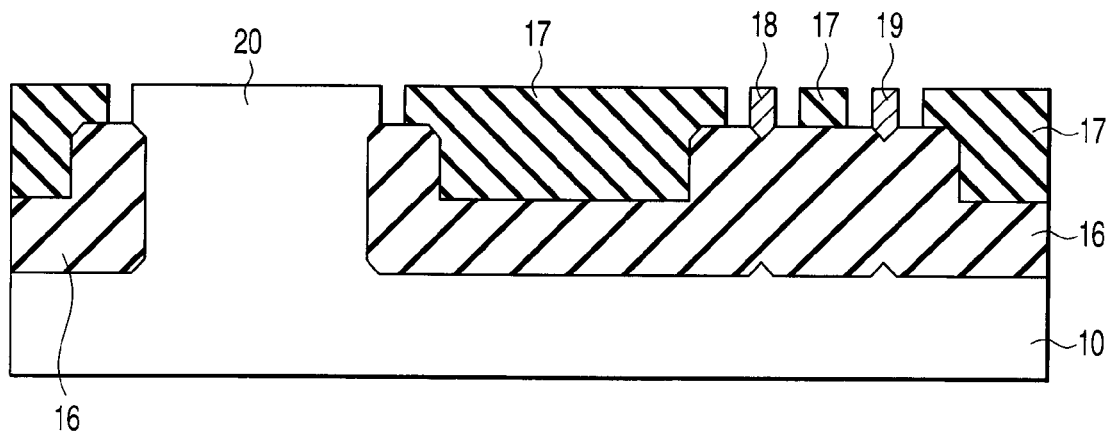
FIG. 11 is a cross sectional view showing one step of the manufacturing method of the semiconductor device following the step of FIG. 10.

Next, as shown in FIG. 11, the upper surfaces and both side surfaces of the fins 18, 19 in the fin FET region are exposed by removing the SiN hard masks 11, 12, 13 and SiN side wall insulating films 14 by use of hot phosphorus acid or the like.

Figure 12:
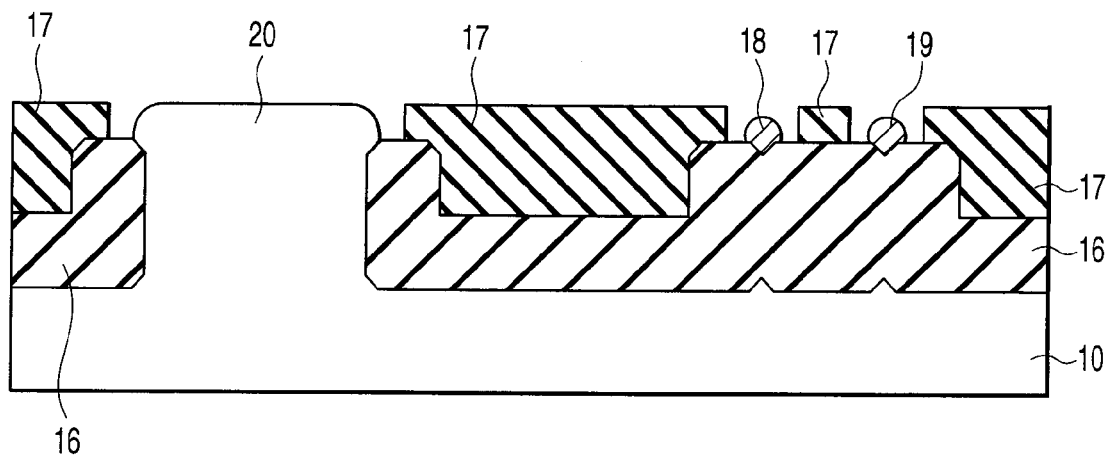
FIG. 12 is a cross sectional view showing one step of the manufacturing method of the semiconductor device following the step of FIG. 11.

After this, as shown in FIG. 12, the resultant semiconductor structure is annealed at a temperature of 800° C. in an atmosphere containing hydrogen ($H_2$) to round the cross sections of the nano wire-fins 18, 19 and, at the same time, round the cross sections of the edge portions of the planar region 20 of the planar MOSFET which are adjacent to the element isolation insulating films (STI) 17.

The surface of the channel region is smoothed by rounding the cross sections of the nano wire-fins 18, 19, the degree of scattering of carriers is reduced and the mobility is enhanced. Further, the annealing process may be performed in an atmosphere containing nitrogen or the like.

Figure 13:
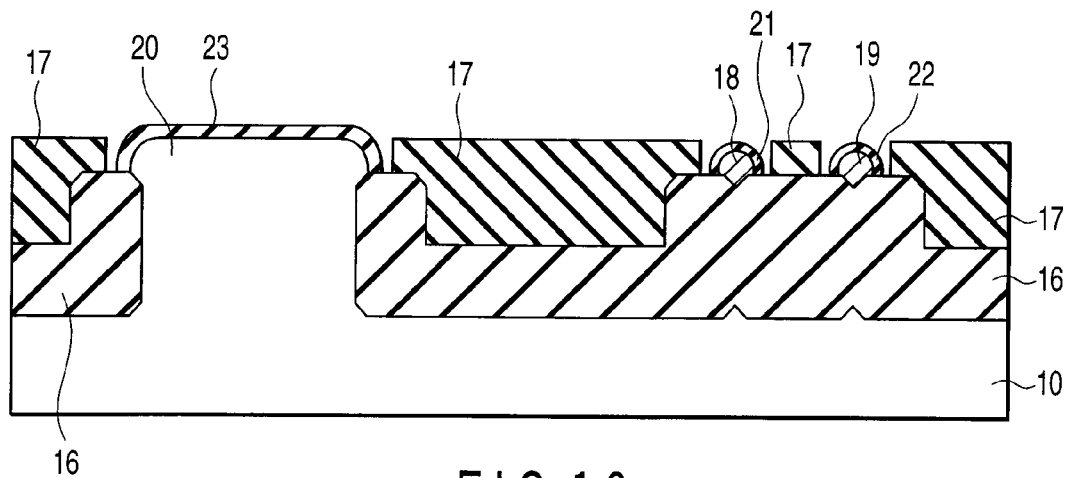
FIG. 13 is a cross sectional view showing one step of the manufacturing method of the semiconductor device following the step of FIG. 12.

Next, as shown in FIG. 13, gate insulating films 21, 22, 23 formed of oxynitride films (SION) are respectively formed on the exposed surfaces of the nano wire-fins 18, 19 (corresponding to the upper surfaces and both side surfaces thereof before rounding) and the surface of the active region 20 of the planar MOSFET.

Figure 14:
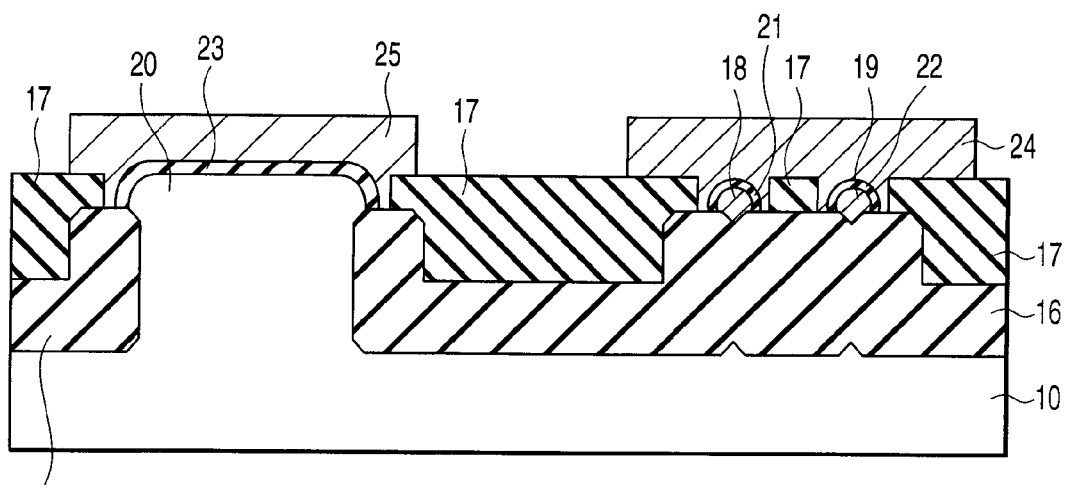
FIG. 14 is a cross sectional view showing one step of the manufacturing method of the semiconductor device following the step of FIG. 13.

Further, a gate electrode material of polysilicon or metal is deposited on the resultant semiconductor structure and then gate electrodes 24, 25 are formed by use of the lithography process and RIE process as shown in FIG. 14.

In the present embodiment, since the height of the gate electrode 24 of the fin FET region is set substantially the same as the height of the gate electrode 25 of the planar MOSFET region, the process margin in the depth of focus of the gate lithography process can be attained. Further, the RIE processes for the fin FET and planar MOSFET can be simultaneously performed. In addition, since the gate surface is made flat, the sidewall pattern transfer process can be used for the gate pattern process.

Since the upper surface and both side surfaces of the fin are used as the channel in the fin FET manufactured in the present embodiment, the FET is similar to an Ω-gate fin FET or tri gate fin FET.

After this, spacers are formed on both side surfaces of the gate electrode 24 of FIG. 14 in the direction perpendicular to the drawing sheet and source/drain regions (not shown) are formed by ion-implantation and silicidation. The value of the aspect ratio of the nano wire-fins 18, 19 is small. Therefore, the doping process to form source/drain diffusion layers in the fins 18, 19 may be performed by an ion-implantation process in which the angle with respect to the direction perpendicular to the substrate is set to 0 to 7 degrees unlike the case of a normal fin with the high aspect ratio. Therefore, since the technique of high cost such as the oblique ion-implantation technique or plasma doping technique which is required to uniformly dope impurities in the channel width direction (fin height direction) with respect to the fin of the high aspect ratio is made unnecessary, the cost for the process can be lowered.

The manufacturing process performed after this is the same as the normal LSI manufacturing process. That is, an inter-layer insulating film is deposited, contact holes are formed and upper-layer wirings (of Cu, for example) are formed by use of a damascene process or the like (not shown).

In the manufacturing method of the semiconductor device according to the first embodiment, the number of manufacturing steps can be reduced due to the following reasons and the like. That is, (a1) the lithography process and RIE process for the gates of the fin region and planar region can be simultaneously performed, (a2) the recess etching process for the element isolation insulating film (STI) around the fin region which is required to form fins in the process for manufacturing fin FETs on the bulk Si substrate can be made unnecessary, (a3) it becomes unnecessary to form an impurity layer of high impurity concentration as a punch-through stopper under the fin since the oxide insulating film is formed directly under the lower portion of the fin, and (a4) it becomes unnecessary to perform the lithography process used to separately form the fin and planar structures.

Further, even though an inexpensive bulk Si substrate is used as the substrate, a nano wire-fin FET with the SOI structure can be formed. Therefore, it is not necessary to use an expensive SOI substrate and the merit that the cost can be lowered is attained.

In addition, the deep element isolation insulating film (STI) and the nano wire with the small diameter can be formed on the bulk substrate with the heights of the surfaces thereof set equal to each other. If the heights of the surfaces thereof are set equal to each other, the merit that the manufacturing process performed after this can be simplified is attained. For example, since the requirement for the depth of focus (DOF) of the lithography process can be alleviated, the resolution can be enhanced.

Further, since the over-etching amount for the gate insulating film in the RIE process for the gate electrode can be reduced, the reliability for the film can be enhanced. This is because the time for the gate insulating film in the planar MOSFET region to be over-etched can be reduced when the gate of the fin FET is subjected to the RIE process since the difference between the thickness of the gate of the fin region (particularly, portions near both of the side surfaces of the fin) and the thickness of the gate of the planar MOSFET region is smaller than that in the case of the conventional fin FET.

As described above, according to the first embodiment, the nano wire-fin FET and planar MOSFET device can be formed together with low cost by use of a simple process.

Second Embodiment

The manufacturing method of a semiconductor device according to a second embodiment of this invention is explained below with reference to FIGS. 15 to 21 which are cross sectional views of the semiconductor device in the respective manufacturing steps.

Also, in the second embodiment, a nano wire-fin FET is formed on the same substrate on which a planar MOSFET is formed. In this case, however, the second embodiment is different from the first embodiment in that the damascene process is used for formation of the gates of the nano wire-fin FETs and the gate-all-around type device in which the surrounding portion of the fin is used as a channel is formed.

Figure 15:
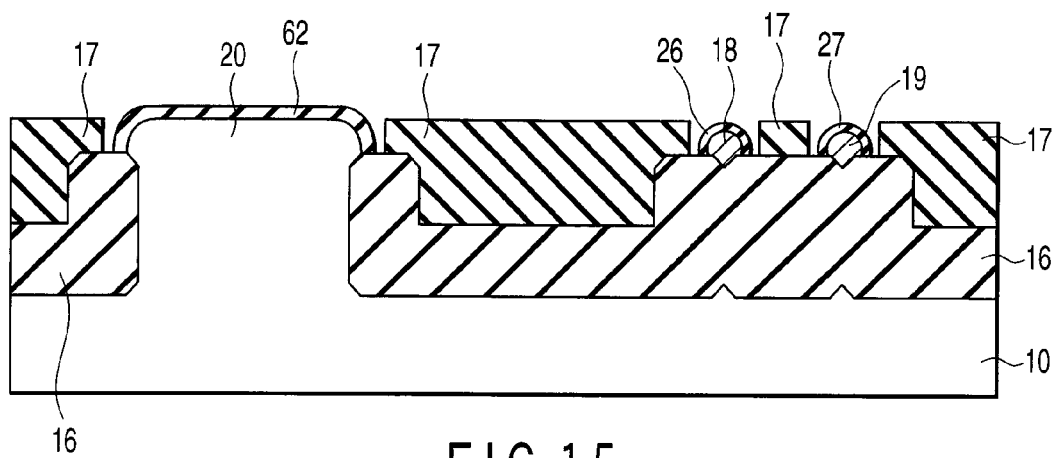
FIG. 15 is a cross sectional view showing one step of a manufacturing method of a semiconductor device according to a second embodiment of this invention.

The steps until the step shown in FIG. 12 in the second embodiment are the same as those of the first embodiment and the explanation thereof is omitted. Then, as shown in FIG. 15, dummy gate insulating films 26, 27, 62 formed of $SiO_2$ are formed on the active region surfaces of the exposed surfaces of the nano wire-fins 18, 19 (corresponding to the upper surfaces and both side surfaces thereof before rounding) and the surface of the planar region 20.

Figure 16:
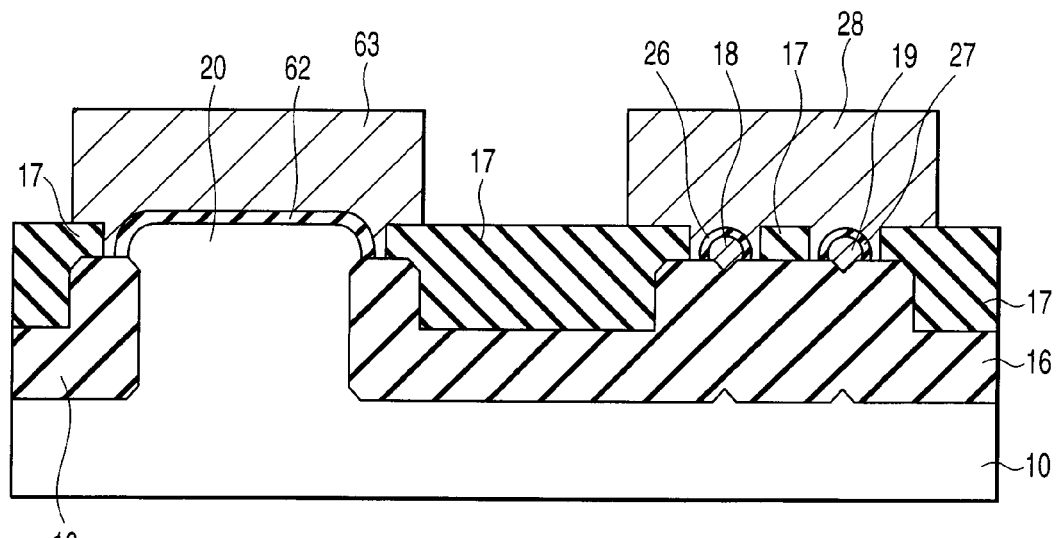
FIG. 16 is a cross sectional view showing one step of the manufacturing method of the semiconductor device following the step of FIG. 15.

Further, a dummy gate electrode material such as polysilicon is deposited on the resultant semiconductor structure and then dummy gate electrode patterns 28 and 63 are formed by the lithography and RIE processes as shown in FIG. 16. The dummy gates 28 and 63 are to be removed in the later step and are required to perform the gate formation process by use of the damascene process.

After this, spacers are formed on both side surfaces of the dummy gates 28 and 63 in the direction perpendicular to the drawing sheet of FIG. 16 and source/drain regions (not shown) are formed by ion-implantation or silicide attachment. Also, in the second embodiment, the doping process for formation of source/drain diffusion layers in the fins 18, 19 whose aspect ratios are low may be performed by an ion-implantation process in which the angle with respect to the direction perpendicular to the substrate is set to 0 to 7 degrees and the cost for the process can be lowered.

Figure 17:
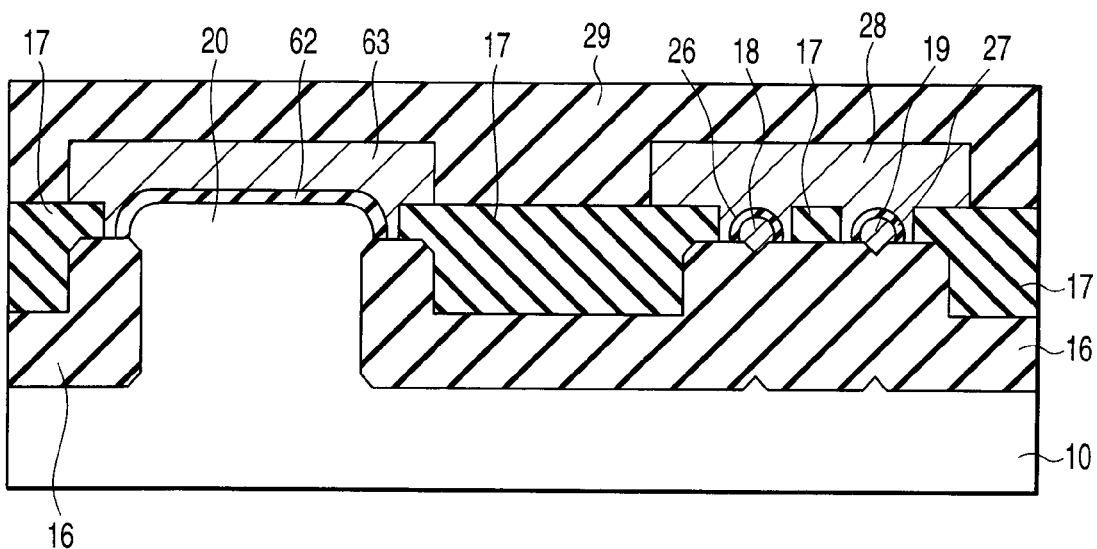
FIG. 17 is a cross sectional view showing one step of the manufacturing method of the semiconductor device following the step of FIG. 16.
Figure 18:
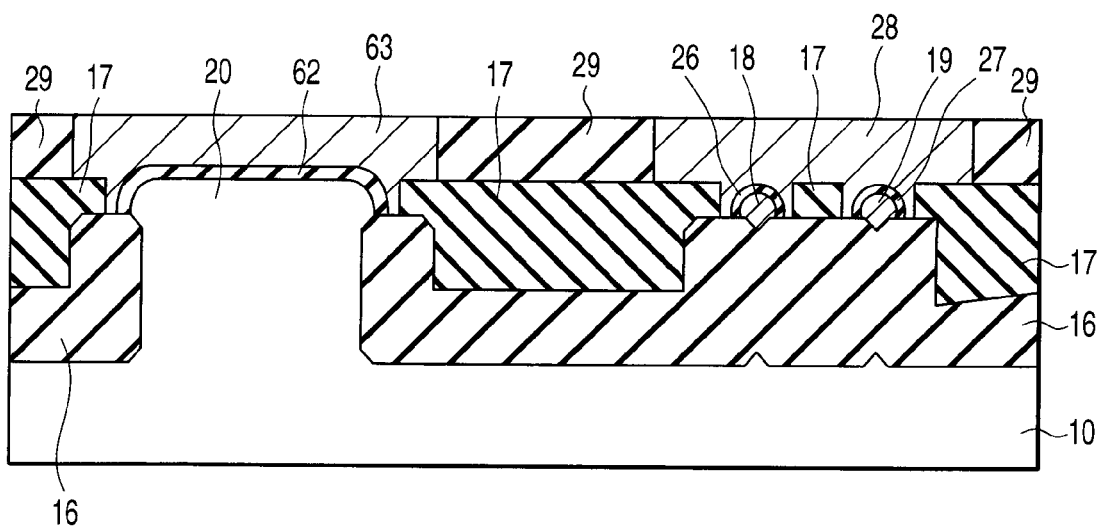
FIG. 18 is a cross sectional view showing one step of the manufacturing method of the semiconductor device following the step of FIG. 17.

Next, as shown in FIG. 17, an SiO$_2$ film (which is hereinafter referred to as a TEOS film) 29 is deposited to the thickness of approximately 300 nm by use of TEOS on the entire surface of the semiconductor structure containing the dummy gates 28 and 63. Then, the surface of the semiconductor structure is made flat by use of the CMP process as shown in FIG. 18 to expose the top surfaces of the dummy gates 28 and 63.

Figure 19:
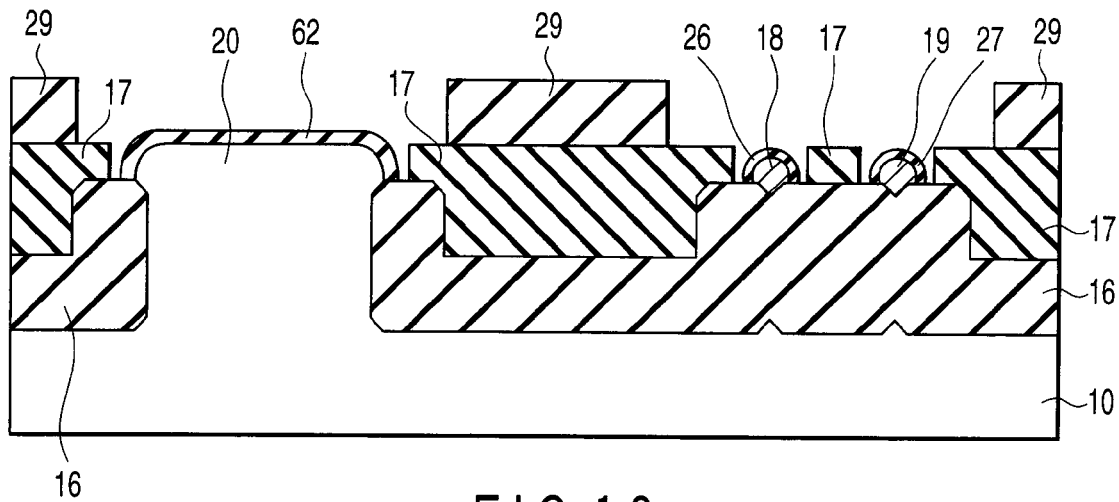
FIG. 19 is a cross sectional view showing one step of the manufacturing method of the semiconductor device following the step of FIG. 18.
Figure 20:
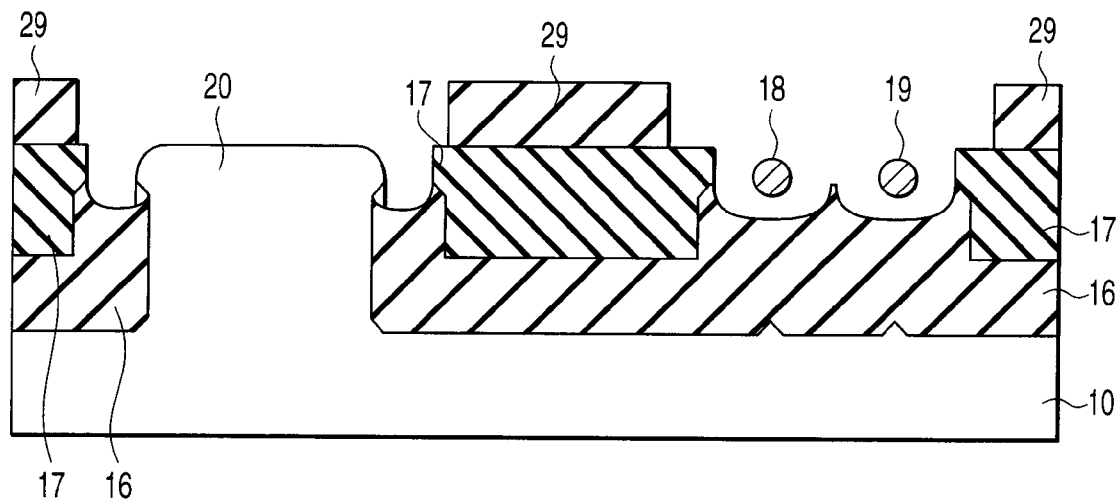
FIG. 20 is a cross sectional view showing one step of the manufacturing method of the semiconductor device following the step of FIG. 19.
Figure 21:
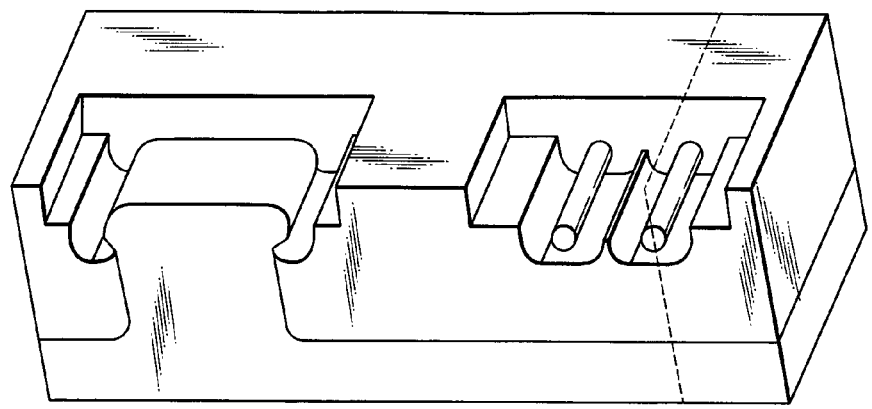
FIG. 21 is a perspective view corresponding to the cross sectional view of FIG. 20.

After this, as shown in FIG. 19, the dummy gates 28 and 63 are etched and removed by use of CDE (Chemical Dry Etching) or the like. Further, the etching process is further performed by use of an HF (hydrofluoric acid) medical fluid, the bottom portions of the Si-nano wires 18, 19 in the channel region are further etched and hollow structures are formed as shown in FIG. 20. That is, the structure in which the nano wires 18, 19 float in air like bridges is obtained. The perspective view of the state of FIG. 20 is shown in FIG. 21.

Figure 22:
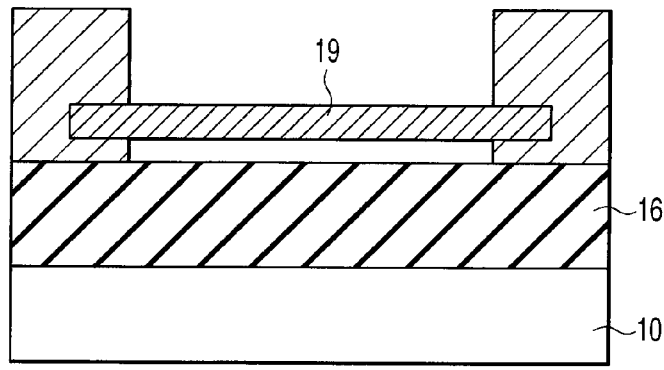
FIG. 22 is a cross sectional view taken along dotted lines of FIG. 21.

In this case, since the source/drain regions lying in the front and rear portions in the direction perpendicular to the drawing sheet of FIG. 20 support the nano wires 18, 19, there is no possibility that the nano wires 18, 19 are lifted off. The state is shown in FIG. 22 which is a cross sectional view taken along the dotted lines of FIG. 21.

Figure 23:
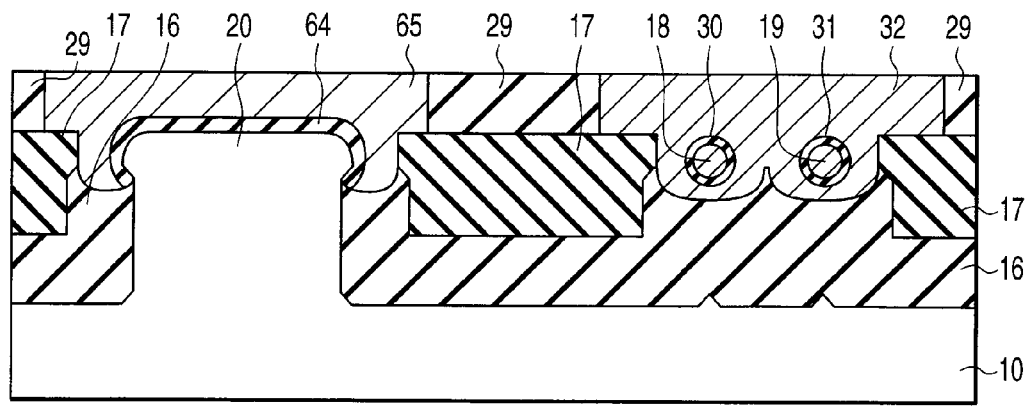
FIG. 23 is a cross sectional view showing one step of the manufacturing method of the semiconductor device following the step of FIG. 20.

Then, as shown in FIG. 23, gate insulating films 30, 31 and 64 formed of oxynitride films (SiON) are formed on the entire surfaces of the nano wires 18, 19 (corresponding to the upper surfaces, side surfaces and bottom surfaces of the fins) and the surface of the planar region 20. Further, gate electrode materials 32 and 65 of, for example, metal materials are deposited from above the resultant semiconductor structure. Then, the semiconductor structure is made flat by use of the CMP process and the gate electrode materials in unnecessary portions are removed.

The gate electrodes 32 and 65 may be formed of pure metal or metal silicide. Further, it may be formed of FUSI (fully silicided) gate electrodes. That is, after formation of the gate trenches, a gate insulating film is formed, polysilicon (Poly-Si) is deposited on the entire surface and then a CMP process is performed to fill polysilicon in the trenches. After this, Ni or the like may be sputtered to silicide the entire portion of polysilicon.

In the case of the second embodiment, since the entire surrounding portions of the nano wire-fins 18, 19 form channels, gate-all-around-fin FETs can be formed.

The manufacturing process performed after this is the same as the normal LSI manufacturing process. That is, an inter-layer insulating film is deposited, contact holes are formed therein and upper-layer wirings (of Cu, for example) are formed by use of a damascene process or the like (not shown).

In the manufacturing method of the semiconductor device according to the second embodiment, the number of manufacturing steps can be reduced by the same reasons as described in the first embodiment. Further, like the first embodiment, since nano wire-fin FETs with the SOI structure can be formed on an inexpensive bulk Si substrate and an expensive SOI substrate is not used, the cost can be lowered.

In addition, the deep element isolation insulating film (STI) and the nano wire with the small diameter can be formed on the bulk substrate with the heights of the surfaces thereof set equal to each other. Therefore, the manufacturing process performed after this can be simplified. For example, since the requirement for the depth of focus (DOF) of the lithography process can be alleviated, the resolution can be enhanced. Further, since the over-etching amount for the gate insulating film can be reduced in the RIE process for the gate electrode, the reliability for the film can be enhanced.

Also, since the entire surrounding portions of the nano wire-fins form channels, gate-all-around-fin FETs can be formed and transistors can be further miniaturized and formed with higher performances.

As described above, according to the second embodiment, the nano wire-fin FET and planar MOSFET can be formed together with low cost by use of a simple process.

In the second embodiment, the manufacturing cost is lowered when the nano wire-fin FET is formed together with the planar MOSFET on the same substrate while the damascene process is applied for formation of the gate of the nano wire-fin FET. Therefore, the following modifications can be attained.

First, a first modification is explained with reference to FIGS. 24 to 28. The first modification is the same as the above embodiment until the process reaches the step shown in FIG. 18. Then, dopant is ion-implanted into dummy gates 28, 63 formed of polysilicon or the like and an activation annealing process is performed (not shown).

Further, as shown in FIG. 24, a polysilicon planar region is covered with a resist film 66 and the dummy gate 28 is etched and removed by use of the CDE (chemical dry etching) process to form an opening in the fin region. After this, if the resist film 66 is separated and the semiconductor structure is etched by use of an HF (hydrofluoric acid) medical fluid, the bottom portions of the Si-nano wires 18, 19 in the channel region are etched and hollow structures are formed as shown in FIG. 25. The perspective view of the state of FIG. 25 is shown in FIG. 26.

Then, as shown in FIG. 27, gate insulating films 30, 31 formed of oxynitride films (SiON) are formed on the entire surfaces of the nano wires 18, 19 (corresponding to the upper surfaces, side surfaces and bottom surfaces of the fins) and a gate electrode material 32 such as a metal material is deposited from above the resultant semiconductor structure. Finally, the semiconductor structure is made flat by use of the CMP process and the gate electrode material 32 in an unnecessary portion is removed. Then, the planar region is used as the polysilicon electrode 63 and the fin region is used as the metal electrode 32 as shown in FIG. 28. The manufacturing process performed after this is the same as the normal LSI manufacturing process.

Next, a second modification is explained with reference to FIGS. 29 to 30. Also, the second modification is the same as the first modification until the process reaches the step shown in FIG. 28 and FETs in which the planar region is used as the polysilicon electrode and the fin region is used as the metal electrode are formed. However, in this case, the doping process with respect to the dummy gates 28 and 63 formed of polysilicon or the like performed in the first modification as shown in FIG. 18 is not necessarily performed.

First, in the state of FIG. 28, Ni 70 is sputtered as shown in FIG. 29 and then an annealing process is performed. Next, as shown in FIG. 30, surplus Ni 70 is removed by use of a mixed solution of sulfuric acid and hydrogen peroxide solution. The polysilicon region 63 becomes Ni silicide 71 by the above annealing process. The annealing temperature at this time is preferably set at approximately 300° C. to 600° C. and typically set at 500° C.

In this case, it is preferable to form the metal electrode 32 of the fin region by use of a material which is difficult to react with Ni 70 in the annealing process of 500° C. from the viewpoint of easy fabrication. Further, from the viewpoint of work function control, it is preferable to form a double-layered structure using a material which is difficult to react with Ni at the annealing temperature as a cap film when a material which can react with Ni at the annealing temperature at the soliciting time is used. As the material which is difficult to react with Ni, for example, TiN, TaN, WN, AlN, HfC, HfB, TaC and mixtures of the above materials can be used.

Further, C, Cr, Fe, Ge, B, P, As, Sn, Ga, In, Pb, Sb, S, Cl, F can be added for enhancement of the thermal stability and adjustment of the work function. As the material which can react with Ni, for example, Co, Ni, Pt, Ti, Hf, Zr, Ta, W, Mo, Al, alloys of the above materials and mixtures of the above materials with Si can be used. The same additives as described above can be mixed for adjustment of the work function.

According to the present modification, as shown in FIG. 30, the planar region is used as the Ni silicide electrode 71 and the fin region is used as the metal electrode 32. The manufacturing process performed after this is the same as the normal LSI manufacturing process.

Next, a third modification is explained with reference to FIGS. 31 to 33. Also, the third modification is the same as the first modification until the process reaches the step shown in FIG. 28 and FETs in which the planar region is used as the polysilicon electrode and the fin region is used as the metal electrode are formed. However, in this case, the doping process with respect to the dummy gates 28 and 63 formed of polysilicon or the like performed in the first modification as shown in FIG. 18 is not necessarily performed.

Figure 31:
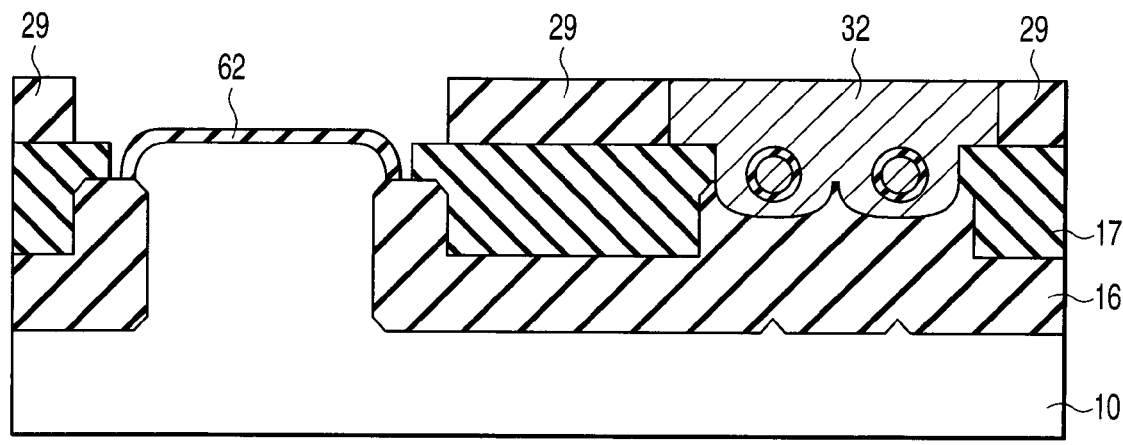
FIG. 31 is a cross sectional view showing one step of a manufacturing method of a semiconductor device according to a third modification of the second embodiment of this invention.
Figure 32:
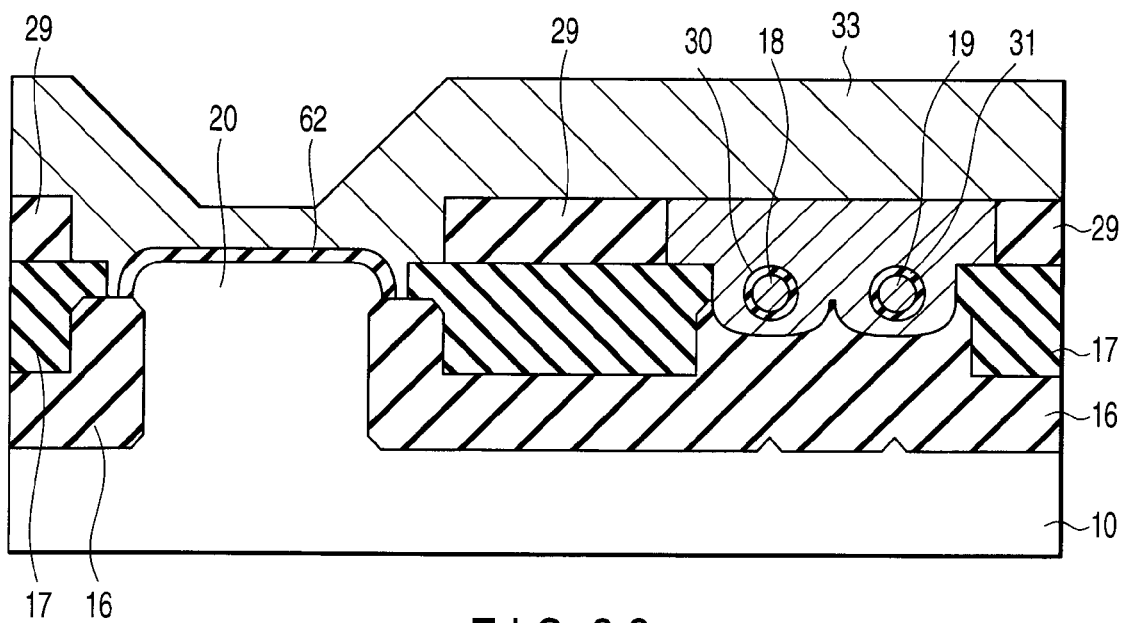
FIG. 32 is a cross sectional view showing one step of the manufacturing method of the semiconductor device following the step of FIG. 31.

First, in the state of FIG. 28, polysilicon 63 of the planar region is removed by use of a CDE process or the like as shown in FIG. 31. Then, a metal electrode 33 for the planar structure is formed as shown in FIG. 32. A material of the metal electrode 33 can be selected from materials provided as the metal materials used for the gate electrode material of the fin region and may be the same as or different from that of the fin region.

Figure 33:
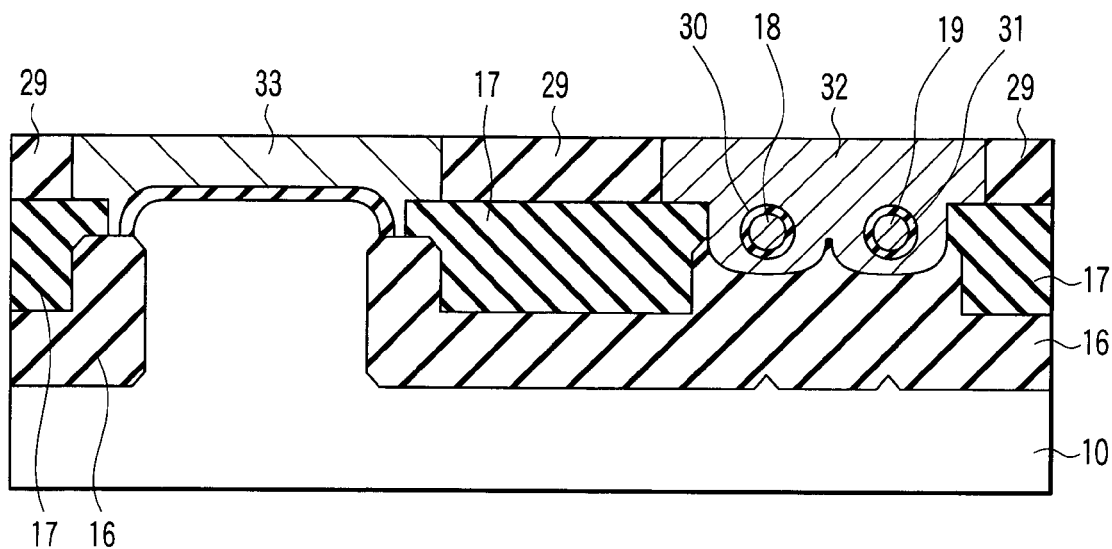
FIG. 33 is a cross sectional view showing one step of the manufacturing method of the semiconductor device following the step of FIG. 32.

Further, the semiconductor structure is made flat by use of the CMP process as shown in FIG. 33. As a result, both of the planar region and fin region are used as metal electrodes. The manufacturing process performed after this is the same as the normal LSI manufacturing process.

In addition, a fourth modification is explained with reference to FIGS. 34 to 42. The fourth modification is the same as the second embodiment until the dummy gate electrodes 26, 27 and 62 are formed in the step of FIG. 15.

Figure 34:
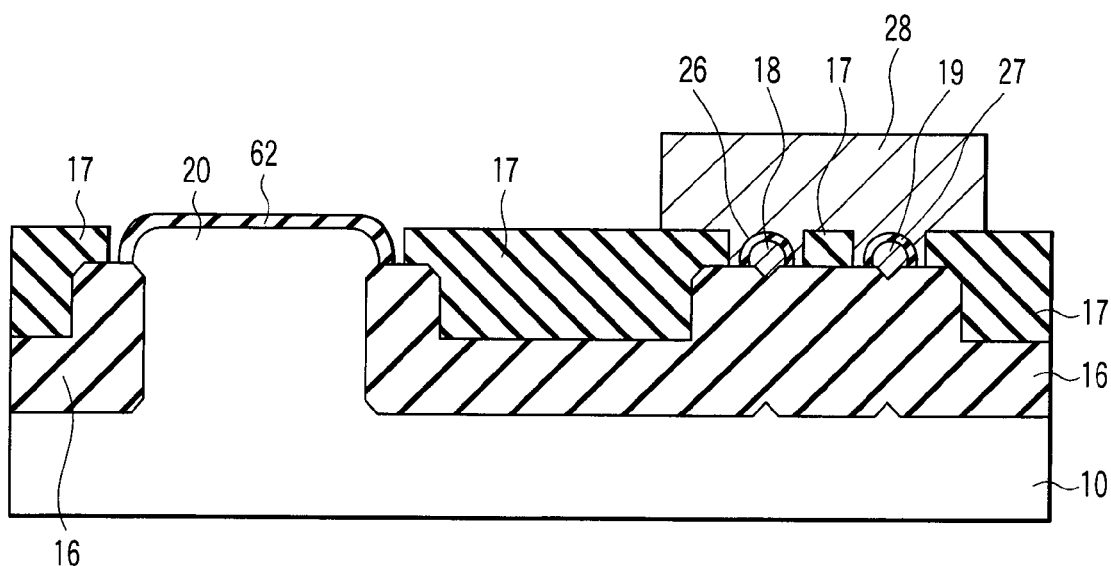
FIG. 34 is a cross sectional view showing one step of a manufacturing method of a semiconductor device according to a fourth modification of the second embodiment of this invention.
Figure 35:
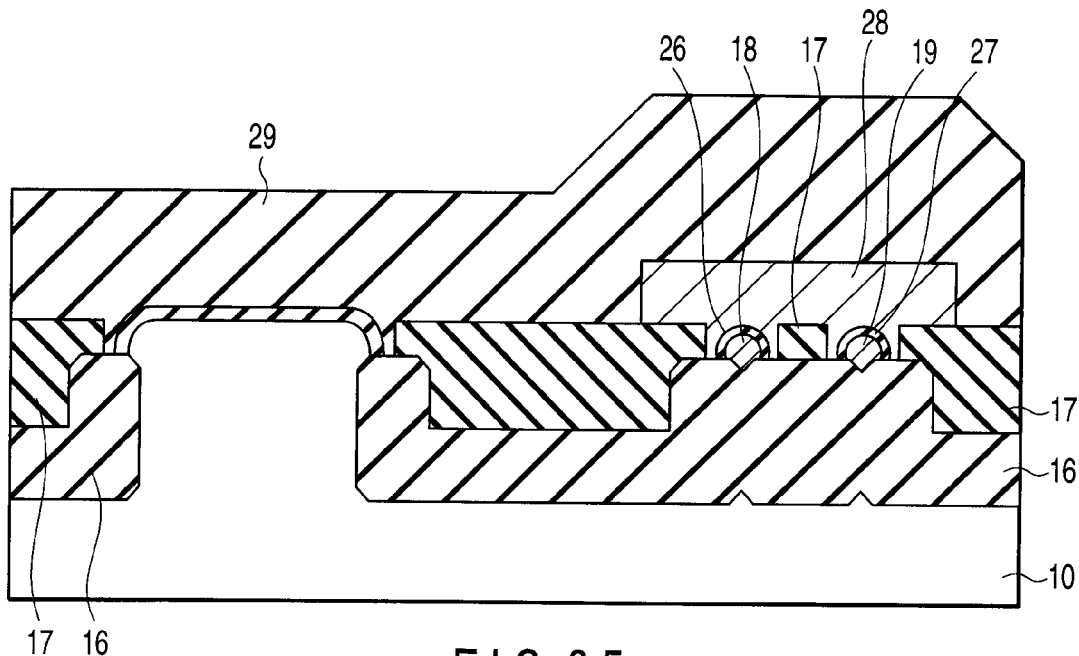
FIG. 35 is a cross sectional view showing one step of the manufacturing method of the semiconductor device following the step of FIG. 34.
Figure 36:
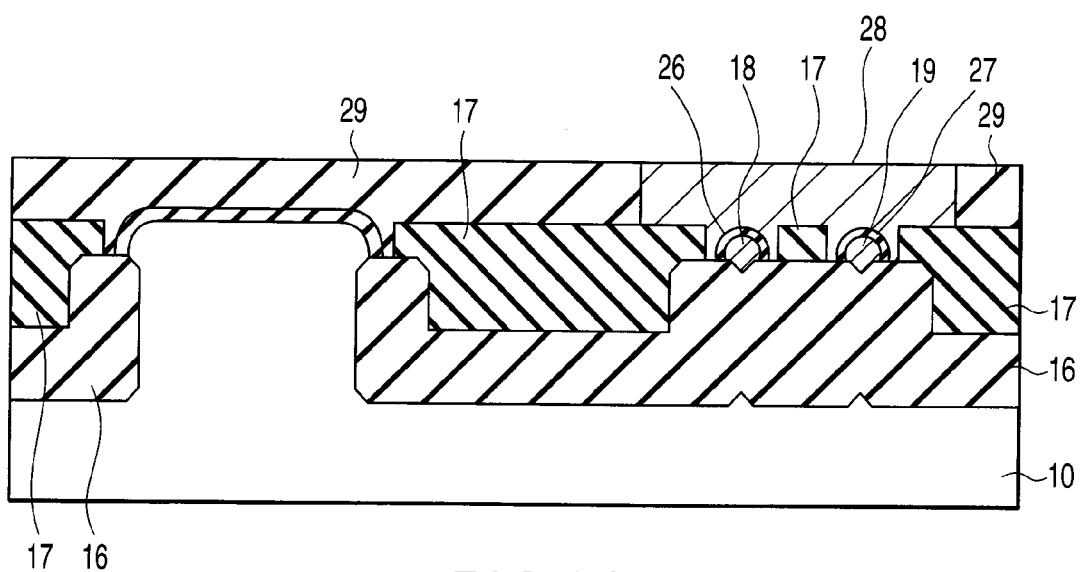
FIG. 36 is a cross sectional view showing one step of the manufacturing method of the semiconductor device following the step of FIG. 35.
Figure 37:
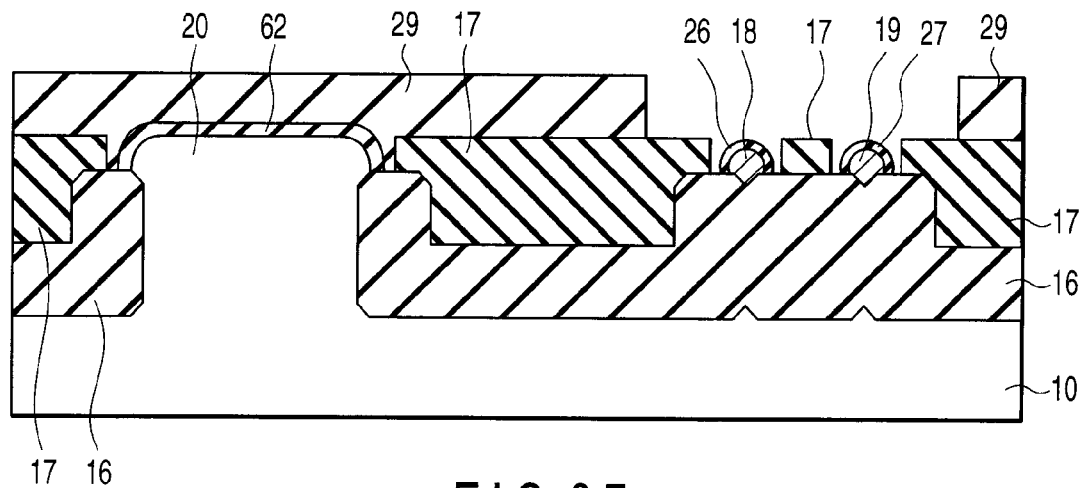
FIG. 37 is a cross sectional view showing one step of the manufacturing method of the semiconductor device following the step of FIG. 36.
Figure 38:
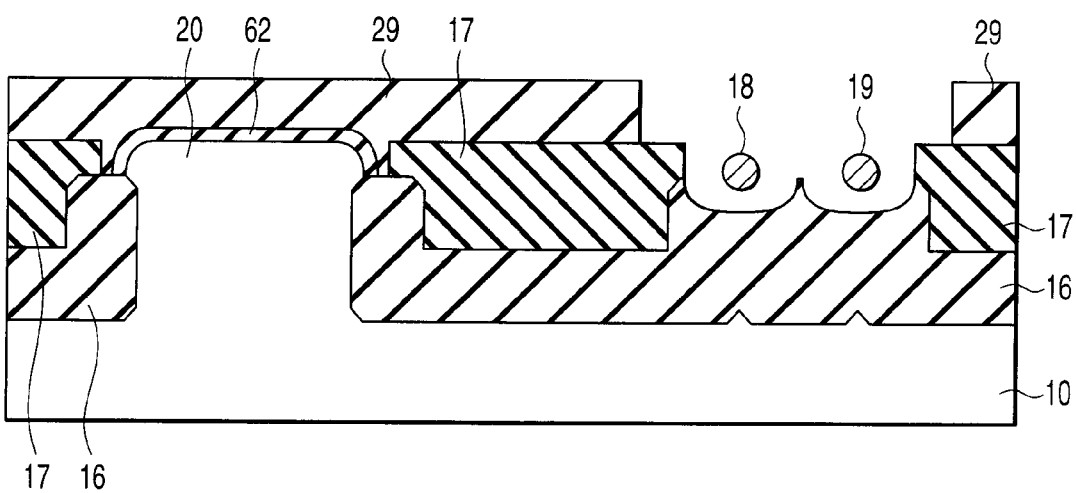
FIG. 38 is a cross sectional view showing one step of the manufacturing method of the semiconductor device following the step of FIG. 37.

After this, dummy gate polysilicon 28 of the fin region is processed and formed as shown in FIG. 34 and then a TEOS film 29 is formed as shown in FIG. 35. Further, as shown in FIG. 36, the semiconductor structure is made flat by use of the CMP process. Next, the dummy gate 28 of the fin region is removed by use of the CDE process as shown in FIG. 37 and the etching process is performed by use of an HF medical fluid as shown in FIG. 38.

Figure 39:
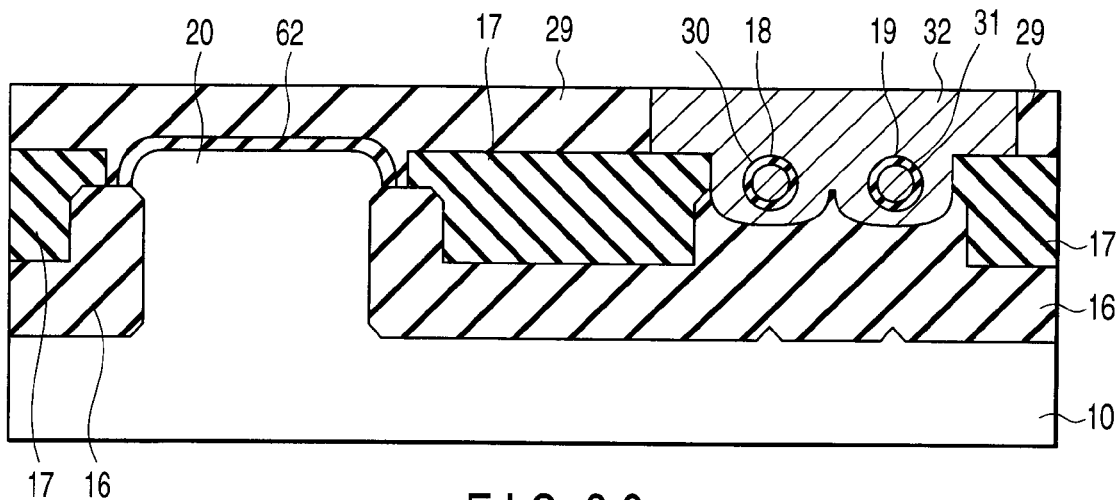
FIG. 39 is a cross sectional view showing one step of the manufacturing method of the semiconductor device following the step of FIG. 38.

After this, gate insulating films 30, 31 formed of oxynitride films (SiON) are formed on the entire surfaces of the nano wires 18, 19, a film of a metal material 32 is formed, the semiconductor structure is made flat by use of the CMP process and, at the same time, surplus metal of the planar region is removed to attain the structure of FIG. 39.

Figure 40:
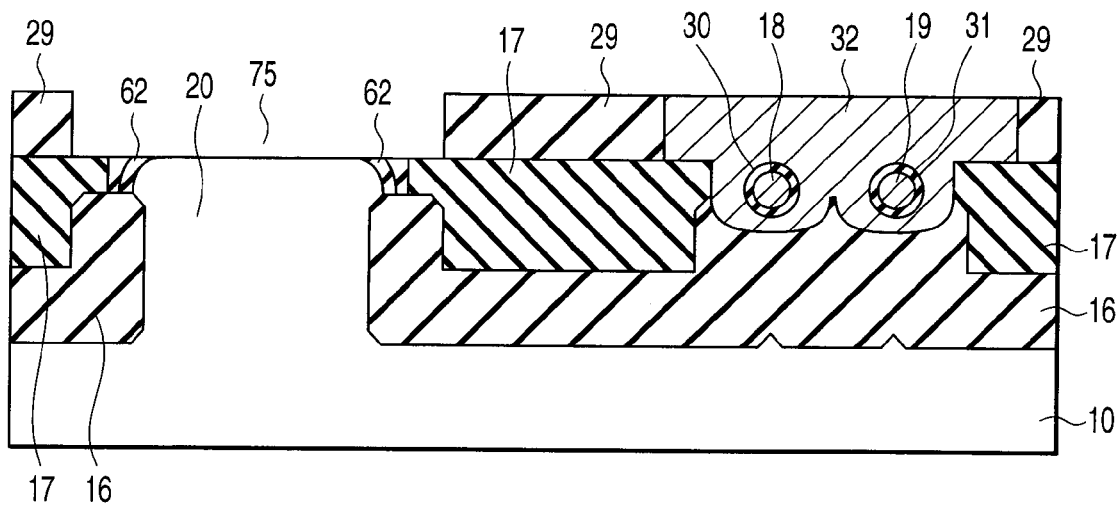
FIG. 40 is a cross sectional view showing one step of the manufacturing method of the semiconductor device following the step of FIG. 39.

Next, as shown in FIG. 40, a trench 75 is formed in correspondence to the gate shape of the planar region in the TEOS film 29. The trench 75 can be attained by forming an opening in a resist film (not shown) in correspondence to the gate shape on the planar region by use of the lithography method and etching the TEOS film 29 by use of the RIE process. In this case, not only the RIE process but also the etching process using HF can be used in combination.

Figure 41:
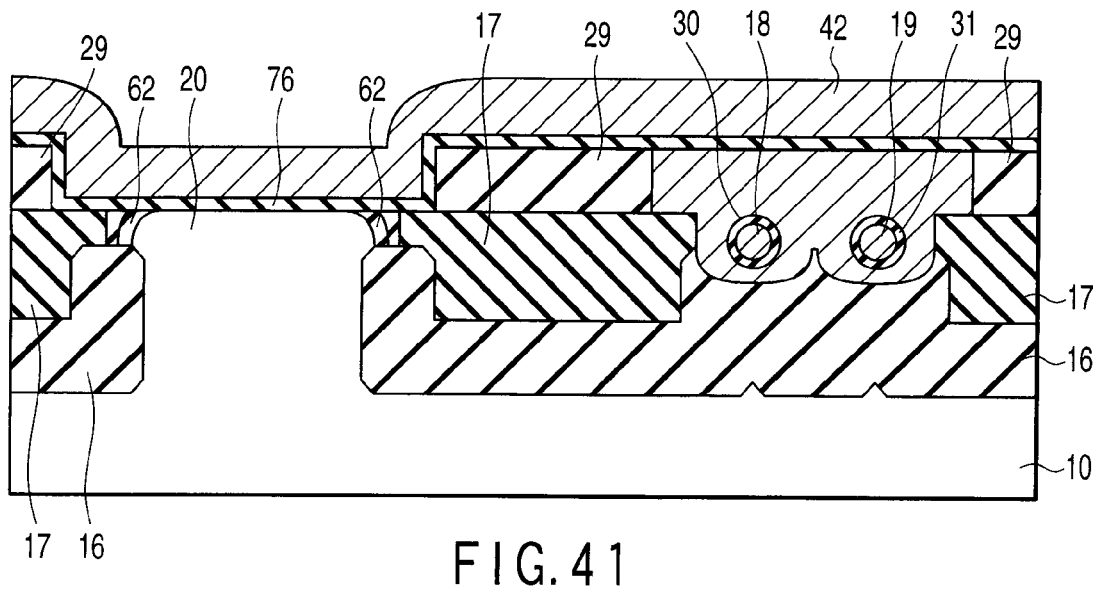
FIG. 41 is a cross sectional view showing one step of the manufacturing method of the semiconductor device following the step of FIG. 40.
Figure 42:
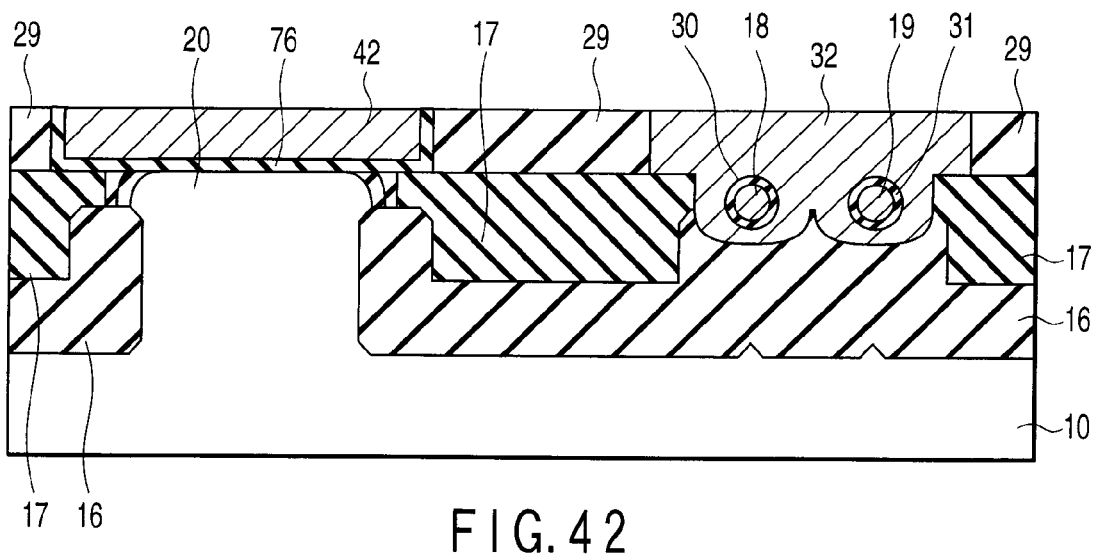
FIG. 42 is a cross sectional view showing one step of the manufacturing method of the semiconductor device following the step of FIG. 41.

Next, as shown in FIG. 41, a gate insulating film 76 and metal electrode 42 are formed. Finally, as shown in FIG. 42, the semiconductor structure is made flat by use of the CMP process and, at the same time, surplus metal of the fin region is removed. As a result, both of the planar region and fin region are used as the metal electrodes 42, 32. The manufacturing process performed after this is the same as the normal LSI manufacturing process.

As explained above, according to the modifications of the present embodiment, the nano wire-fin FET and planar MOSFET device can be formed together with low cost by a simple process.

Third Embodiment

The manufacturing method of a semiconductor device according to a third embodiment of this invention is explained below with reference to FIGS. 43 to 57.

In the third embodiment, planar regions are simultaneously formed at both ends of the fin of the nano wire-fin FET as shown in FIG. 1.

Also, in the third embodiment, the steps which are basically the same as the steps of FIGS. 2 to 11 of the first embodiment are performed. However, in the present embodiment, unlike the case of FIG. 3, hard masks 35 having shapes in which the planar regions with larger lateral width than the fin are connected to both ends of the nano wire-fin are formed on a bulk Si substrate 10 as shown in the top plan view of FIG. 43.

In this case, for example, the hard mask 35 is formed of an SiN film with the film thickness of approximately 50 nm, but it may be formed of an insulating film of $SiO_2$ or SiON, a laminated film of $SiN/SiO_2/SiN$ or another insulating film. The cross sectional view taken along the B-B' line of FIG. 43 and the cross sectional view taken along the A-A' line of FIG. 43 are respectively shown in FIGS. 44A and 44B.

Figure 43:
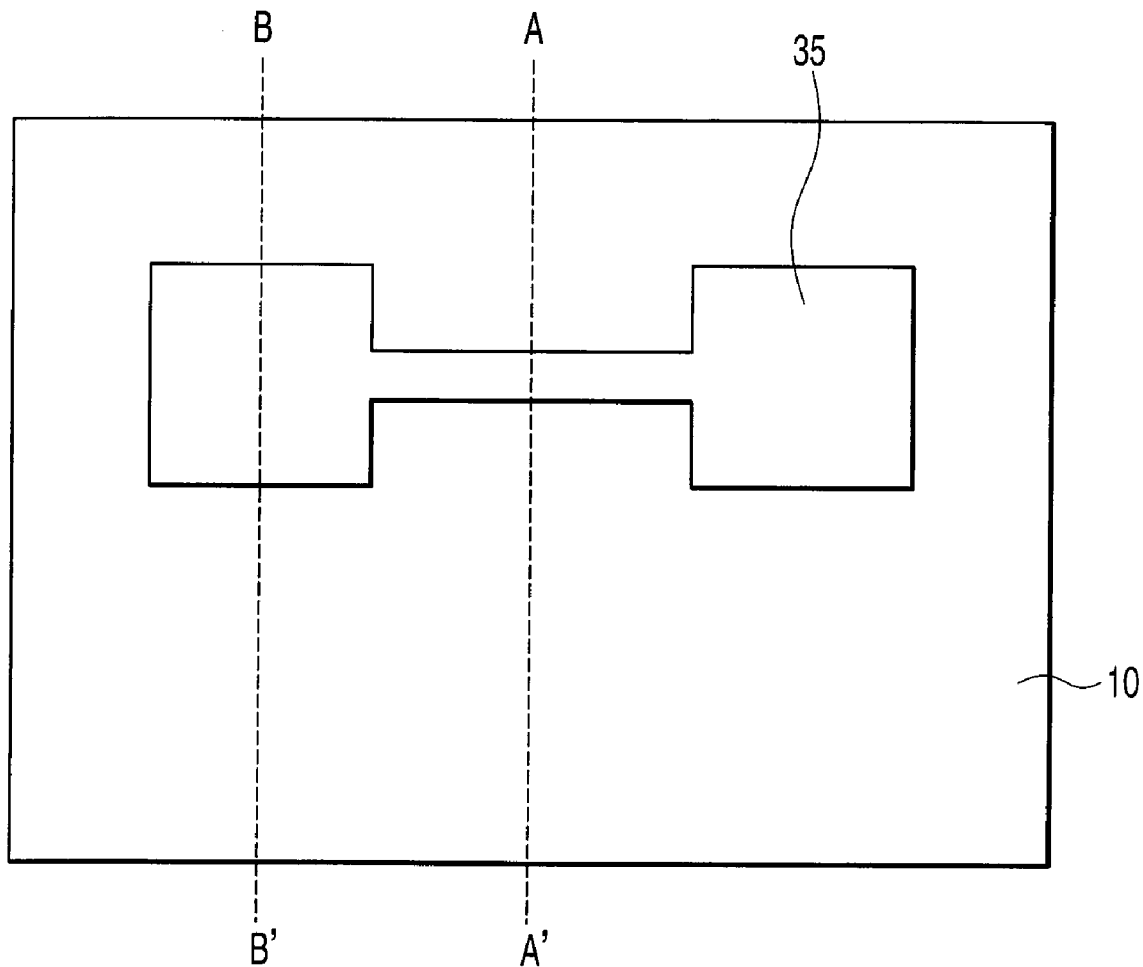
FIG. 43 is a top plan view showing one step of a manufacturing method of a semiconductor device according to a third embodiment of this invention.
Figure 44A:
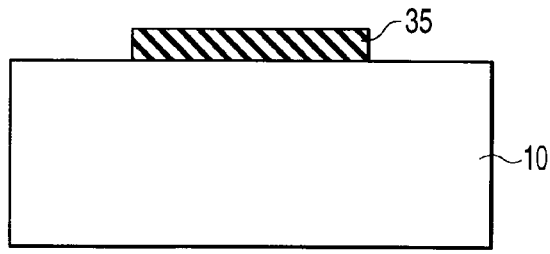
FIG. 44A is a cross sectional view taken along the B-B' line of FIG. 43.
Figure 44B:
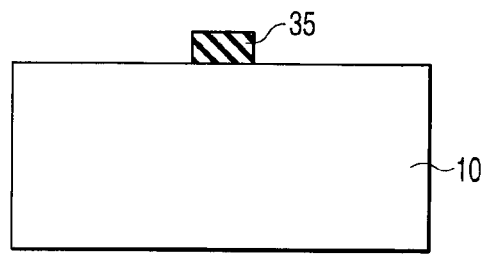
FIG. 44B is a cross sectional view taken along the A-A' line of FIG. 43.

After this, like the steps shown in FIGS. 4 to 11 of the first embodiment, the steps shown in FIGS. 45A, 45B to FIGS. 52A to 52B respectively corresponding to the cross section (planar region) taken along the B-B' line of FIG. 43 and the cross section (fin region) taken along the A-A' line are performed.

Figure 45A:
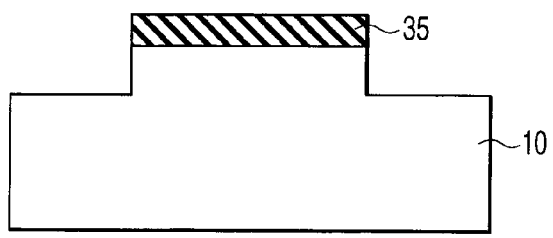
FIG. 45A is a cross sectional view taken along the B-B' line and showing one step of the manufacturing method of the semiconductor device following the step of FIG. 44A.
Figure 45B:
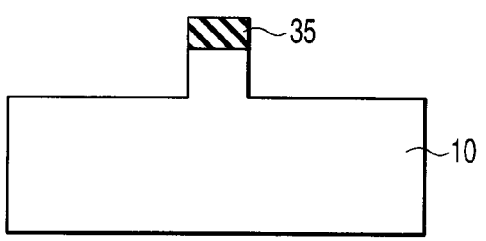
FIG. 45B is a cross sectional view taken along the A-A' line and showing one step of the manufacturing method of the semiconductor device following the step of FIG. 44B.

First, trenches with the depth of approximately 20 nm are formed in the bulk Si substrate 10 as shown in FIGS. 45A, 45B by performing the RIE process with the hard masks 35 used as a mask. In this example, only portions of the trenches on both sides of the hard mask are shown in FIGS. 45A, 45B. For example, FIGS. 45A, 45B may be regarded as cross sectional views in which portions of the cross sections of a plurality of hard masks 35 shown in FIG. 43 are arranged in parallel and the same structures as that of FIGS. 45A, 45B are arranged side by side on both sides of FIGS. 45A, 45B. This applies to the following description.

Figure 46A:
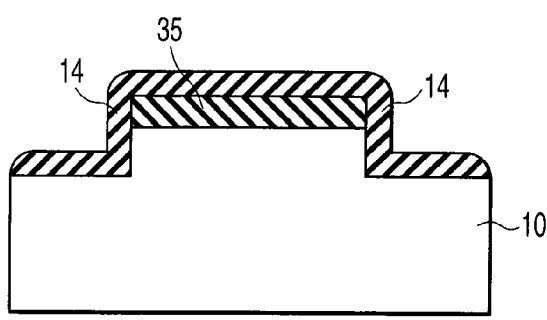
FIG. 46A is a cross sectional view taken along the B-B' line and showing one step of the manufacturing method of the semiconductor device following the step of FIG. 45A.
Figure 46B:
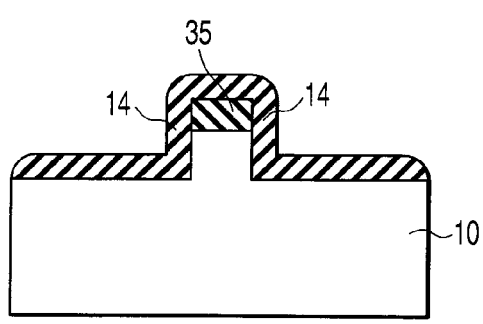
FIG. 46B is a cross sectional view taken along the A-A' line and showing one step of the manufacturing method of the semiconductor device following the step of FIG. 45B.
Figures 47A, 47B:
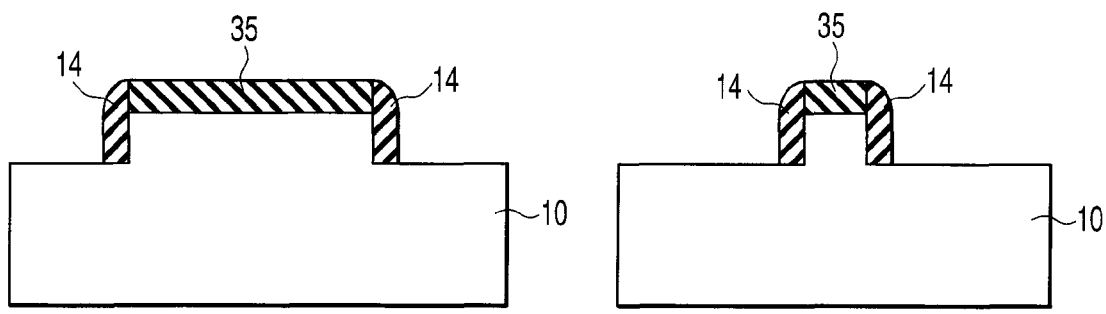
FIG. 47A is a cross sectional view taken along the B-B' line and showing one step of the manufacturing method of the semiconductor device following the step of FIG. 46A.
FIG. 47B is a cross sectional view taken along the A-A' line and showing one step of the manufacturing method of the semiconductor device following the step of FIG. 46B.

After this, an SiN film 14 is formed on the entire surface as shown in FIGS. 46A, 46B and then SiN side wall insulating films 14 with the thickness of approximately 20 nm are formed on the side surfaces of the trenches by performing an etching process as shown in FIGS. 47A, 47B. As the side wall insulating film 14, an insulating film of $SiO_2$ or SiON or another insulating film can be used.

Figures 48A, 48B:
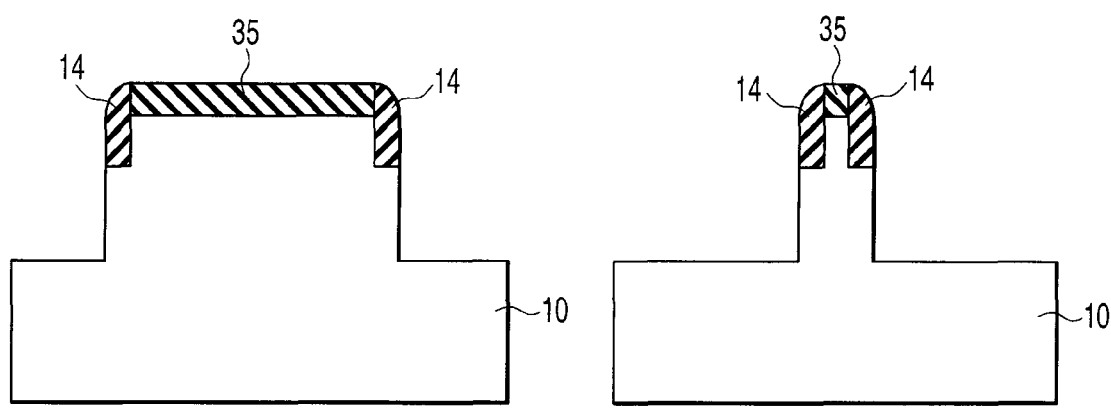
FIG. 48A is a cross sectional view taken along the B-B' line and showing one step of the manufacturing method of the semiconductor device following the step of FIG. 47A.
FIG. 48B is a cross sectional view taken along the A-A' line and showing one step of the manufacturing method of the semiconductor device following the step of FIG. 47B.

Next, as shown in FIGS. 48A, 48B, the Si substrate 10 is etched to further deeply dig the trenches with the hard mask 35 and side wall insulating films 14 used as a mask.

Then, as shown in FIGS. 49A, 49B, the surface portions of the Si substrate 10 which are exposed to the bottom portions of the trenches are oxidized with the hard mask 35 and side wall insulating films 14 used as a mask to form oxide films 16. At this time, the thickness of the oxide films is adjusted to cause the oxide films 16 extending from both of the side surfaces of the bottom portion of the silicon fin in the fin FET region to come into contact with each other.

As a result, the structure in which a fin region 18 which is a semiconductor region is left behind on the oxide film 16, that is, the SOI structure is partially formed only in the fin FET region. On the other hand, in the planar region formed to have larger width, the oxide films extending from both of the side walls do not come into contact with each other and the SOI structure is not formed.

Figure 51A:
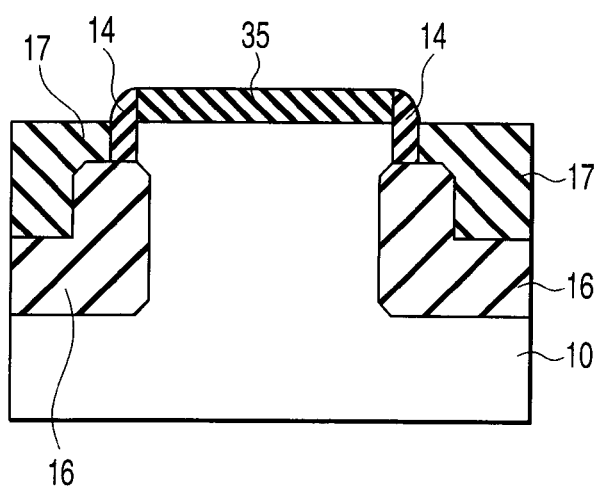
FIG. 51A is a cross sectional view taken along the B-B' line and showing one step of the manufacturing method of the semiconductor device following the step of FIG. 50A.
Figure 51B:
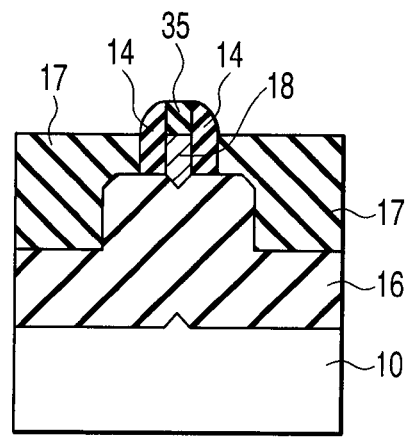
FIG. 51B is a cross sectional view taken along the A-A' line and showing one step of the manufacturing method of the semiconductor device following the step of FIG. 50B.

Next, as shown in FIGS. 50A, 50B, an element isolation insulating film (STI) 17 formed of an $SiO_2$-series insulating film is deposited on the entire surface by use of HDP (High Density Plasma) or the like and then the resultant semiconductor structure is made flat by use of a CMP (Chemical Mechanical Polishing) process to expose the SiN hard mask 35. After this, as shown in FIGS. 51A, 51B, the element isolation insulating film (STI) 17 is further etched.

Figure 52A:
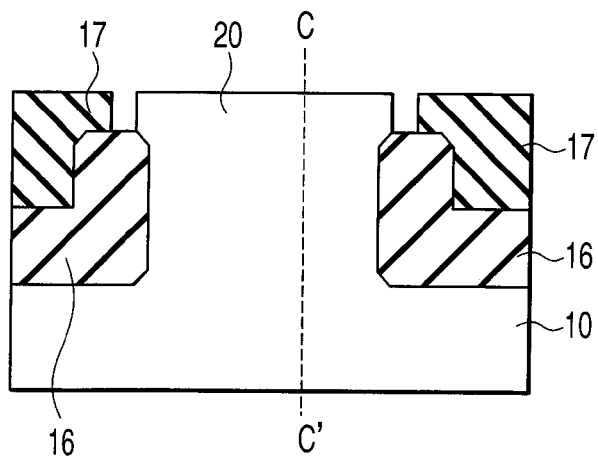
FIG. 52A is a cross sectional view taken along the B-B' line and showing one step of the manufacturing method of the semiconductor device following the step of FIG. 51A.
Figure 52B:
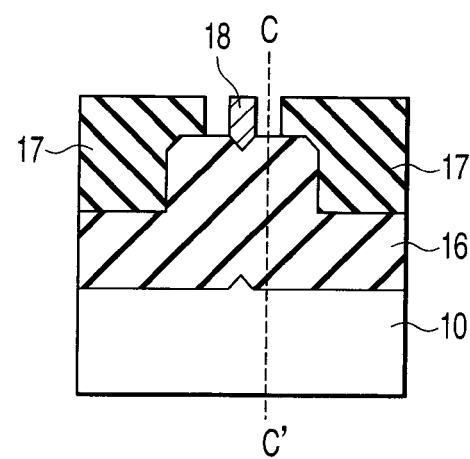
FIG. 52B is a cross sectional view taken along the A-A' line and showing one step of the manufacturing method of the semiconductor device following the step of FIG. 51B.

Next, as shown in FIGS. 52A, 52B, the upper surface and both side surfaces of the fin 18 in the fin FET region are exposed by removing the SiN hard mask 35 and SiN side wall insulating films 14 by use of hot phosphorus acid.

As described above, according to the third embodiment, the fin FET and planar region can be simultaneously subjected to the RIE process.

Figure 53:
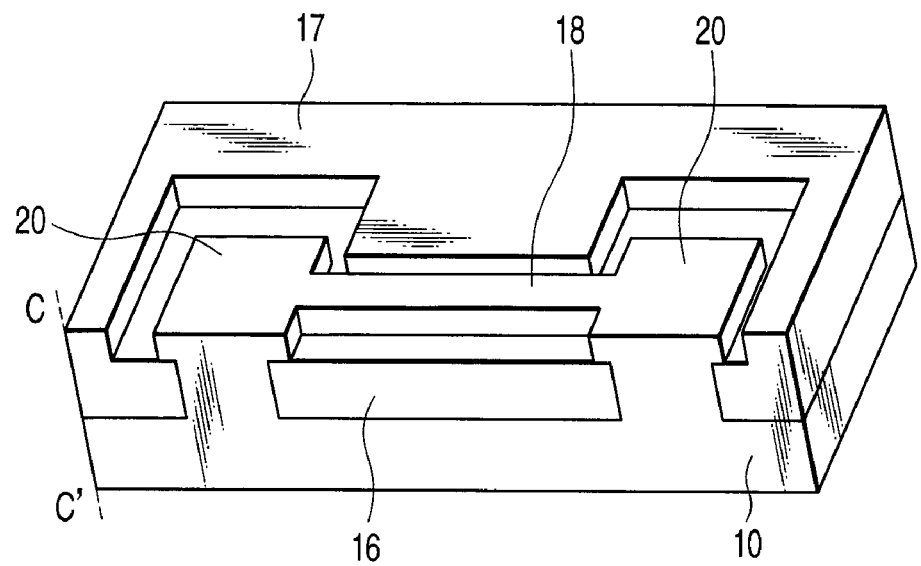
FIG. 53 is a perspective view showing the 3-dimensional structure of the semiconductor device taken along the C-C' lines of the cross sectional views shown in FIGS. 52A and 52B.

FIG. 53 is a perspective view showing the 3-dimensional structure of the semiconductor device taken along the C-C' lines of FIGS. 52A and 52B when the process proceeds to the step shown in FIGS. 52A, 52B. Planar regions 20 having larger lateral width than the nano wire-fin 18 are connected to both end portions of the fin 18.

Figure 54:
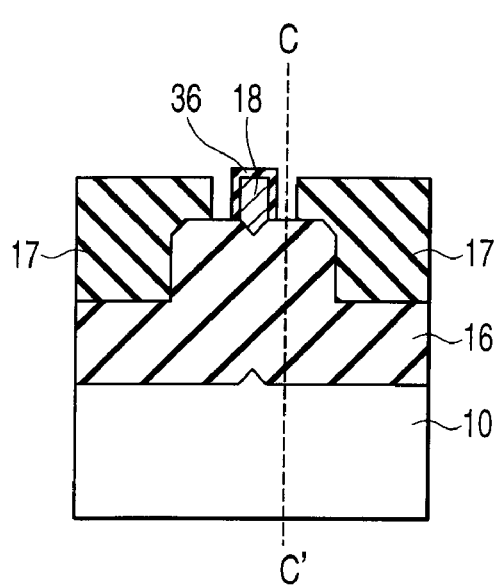
FIG. 54 is a cross sectional view taken along the A-A' line and showing one step of the manufacturing method of the semiconductor device following the step of FIGS. 52A and 52B.

Next, as shown in FIG. 54 which is the cross sectional view taken along the A-A' line, a gate insulating film 36 formed of an oxynitride film (SiON), for example, is formed on the upper surface and both side surfaces of the nano wire-fin 18.

Figure 55:
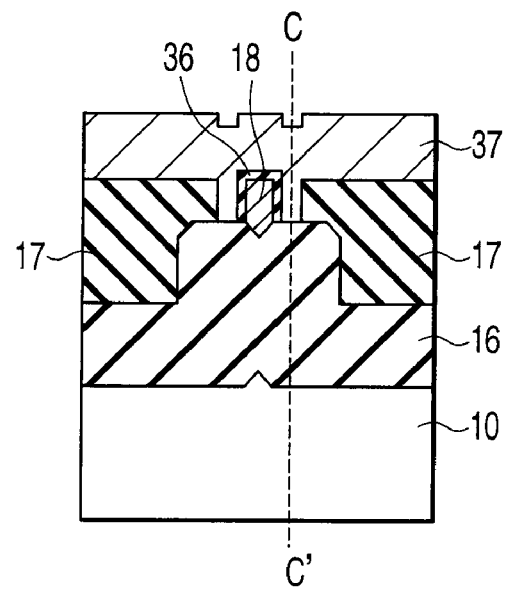
FIG. 55 is a cross sectional view taken along the A-A' line and showing one step of the manufacturing method of the semiconductor device following the step of FIG. 54.
Figure 56:
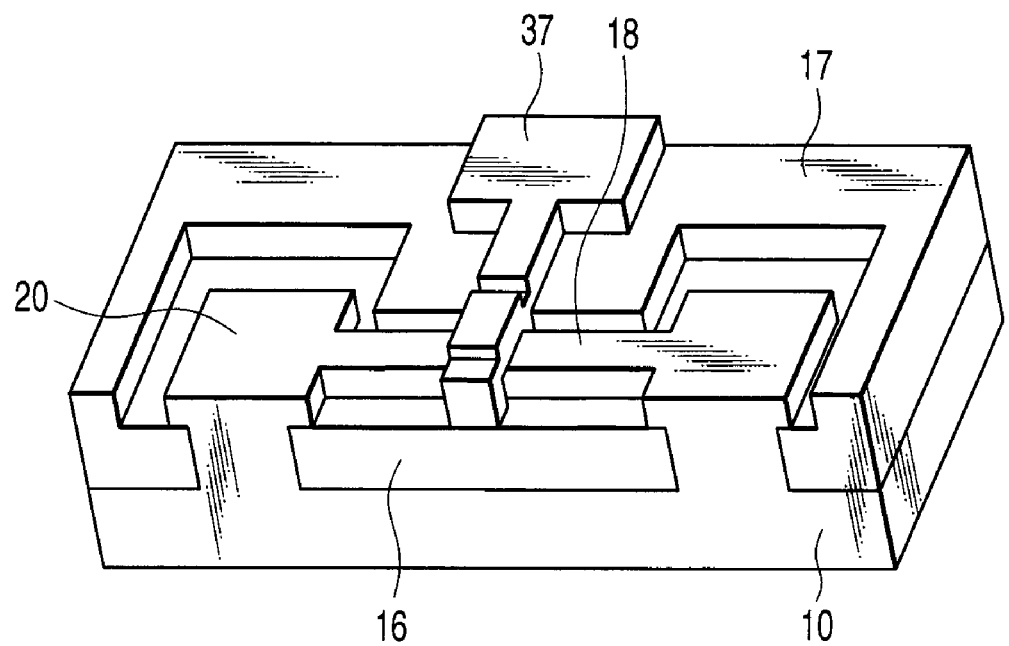
FIG. 56 is a perspective view showing the 3-dimensional structure of the semiconductor device taken along the C-C' line of FIG. 55.

Further, a gate electrode material of polysilicon, metal or the like is deposited on the resultant semiconductor structure and then a gate electrode 37 is formed by use of the lithography process and RIE process as shown in FIG. 55. FIG. 56 is a perspective view showing the 3-dimensional structure of the semiconductor device taken along the C-C' line of FIG. 55.

After this, spacers are formed on both side surfaces of the gate electrode 37 in the direction perpendicular to the drawing sheet of FIG. 55 and source/drain regions (not shown) are formed by ion-implantation and silicidation. The value of the aspect ratio of the fin 18 of the nano wire-fin FET is small. Therefore, the doping process for formation of source/drain diffusion layers may be performed by an ion-implantation process in which the angle with respect to the direction perpendicular to the substrate is set to 0 to 7 degrees. Thus, since the technique of high cost such as the oblique ion-implantation technique or plasma doping technique becomes unnecessary, the cost for the process can be lowered.

The fin FET manufactured in the present embodiment has a channel formed of the upper surface and both side surfaces of the fin and is used as a tri gate fin FET.

Figure 57:
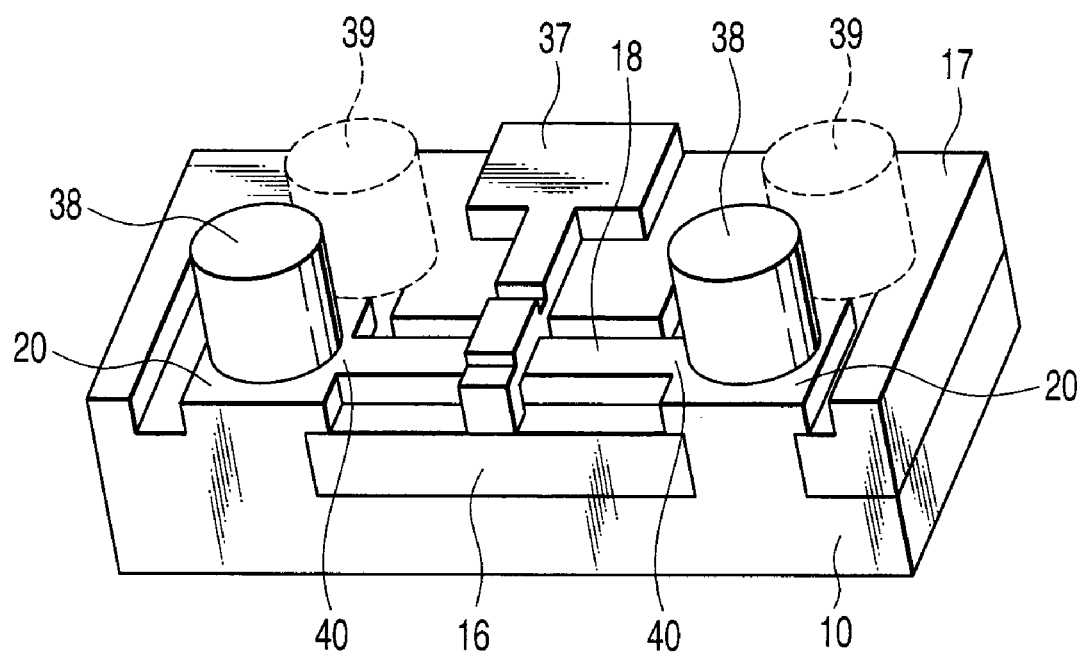
FIG. 57 is a perspective view showing the 3-dimensional structure when contacts are formed on the semiconductor device shown in FIG. 56.

After this, as shown in FIG. 57, an interlayer insulating film is deposited (not shown) and contacts 38 for connection with upper-layer wirings (of Cu, for example) are formed. In this case, since the lateral width of the planar region 20 is made larger than the lateral width of the nano wire-fin 18, the interface resistances between the contacts 38 and the source/drain regions 40 can be made low.

Further, even when the contacts are misaligned and are formed as shown by contacts 39, they can be kept in contact with the planar regions 20 and thus the structure which is highly resistant to misalignment can be attained.

As described above, it is possible to manufacture a semiconductor device having nano wire-fin FETs in which the number of steps can be reduced and the cost can be lowered like the first and second embodiments and, at the same time, the interface resistances with the contacts are low and which are highly resistant to misalignment according to the third embodiment in which the fin FETs and planar regions are simultaneously formed.

As described above, according to one aspect of this invention, a semiconductor device having fin field effect transistors which can be simply formed with the planar regions with low cost and a manufacturing method thereof can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device comprising:

forming a line-form insulating film on a main surface of a semiconductor substrate;

etching the semiconductor substrate with the line-form insulating film used as a mask to form two adjacent first trenches on both sides of the line-form insulating film;

forming side wall insulating films on respective side walls of the adjacent first trenches;

etching the semiconductor substrate with the line-form insulating film and side wall insulating films used as a mask to form second trenches in bottom portions of the adjacent first trenches;

oxidizing the semiconductor substrate with the line-form insulating film and side wall insulating films used as an anti-oxidation mask to cause oxide regions formed on adjacent side walls of the second trenches lying on both sides of the semiconductor substrate to make contact with each other;

removing the line-form insulating film and side wall insulating films;

forming a gate insulating film on a surface of a semiconductor region of the semiconductor substrate which is exposed by removing the line-form insulating film and the side wall insulating films;

forming a gate electrode on the gate insulating film; and forming a fin field effect transistor having the semiconductor region as a line-form fin.

2. The manufacturing method of the semiconductor device according to claim 1, further comprising removing a portion of the oxide regions lying under the semiconductor region to be used as the fin which is formed in contact with the semiconductor region after the removing and before the forming the gate insulating film.

3. The manufacturing method of the semiconductor device according to claim 1, further comprising rounding a cross sectional shape of the semiconductor region to be used as the line-form fin by performing an annealing process in an atmosphere containing hydrogen after the removing and before the forming the gate insulating film.

4. A manufacturing method of a semiconductor device comprising:

simultaneously forming a line-form first insulating film and a second insulating film having larger line width than the first insulating film on a main surface of a semiconductor substrate;

etching the semiconductor substrate with the line-form first and second insulating films used as a mask to form a plurality of first trenches on both sides of the first and second insulating films;

forming side wall insulating films on respective side walls of the plurality of first trenches;

etching the semiconductor substrate with the first and second insulating films and side wall insulating films used as a mask to form second trenches in bottom portions of the plurality of first trenches;

oxidizing the semiconductor substrate with the first and second insulating films and side wall insulating films used as an anti-oxidation mask to cause oxide regions formed on adjacent side walls of the second trenches which lie on both sides of the first insulating film and sandwich the semiconductor substrate to make contact with each other and prevent oxide regions formed on adjacent side walls of the second trenches which lie on both sides of the second insulating film and sandwich the semiconductor substrate from making contact with each other;

removing the first and second insulating films and side wall insulating films;

forming a gate insulating film on a surface of a semiconductor region of the semiconductor substrate which is exposed by removing the first insulating film and forming a gate electrode on the gate insulating film to form a fin field effect transistor having the semiconductor region as a line-form fin; and forming one of a planar field effect transistor and planar region on a different semiconductor region of the semiconductor substrate which is exposed by removing the second insulating film.

5. The manufacturing method of the semiconductor device according to claim 4, further comprising removing a portion of the oxide region lying under the semiconductor region to be used as the fin which is formed in contact with the semiconductor region after the removing and before the forming the gate insulating film.

6. The manufacturing method of the semiconductor device according to claim 4, further comprising rounding a cross sectional shape of the semiconductor region to be used as the fin by performing an annealing process in an atmosphere containing hydrogen after the removing and before the forming the gate insulating film.

7. The manufacturing method of the semiconductor device according to claim 4, further comprising respectively forming dummy gate insulating films on surfaces of the semiconductor region and planar region, forming a dummy gate electrode material on the dummy gate insulating films, and patterning the dummy gate electrode material to form dummy gate electrode patterns.

8. The manufacturing method of the semiconductor device according to claim 7, further comprising forming a TEOS film on the dummy gate electrode patterns, making an upper surface of the TEOS film flat to expose top portions of the dummy gate electrode patterns, and etching and removing the dummy gate electrode patterns and proceeds the etching process to bottom portions of nano wires to form hollow structures.

9. The manufacturing method of the semiconductor device according to claim 8, wherein the forming the hollow structures includes covering the planar region with resist, and forming an opening in the fin region by etching and removing the dummy gate electrode patterns.

10. The manufacturing method of the semiconductor device according to claim 9, further comprising removing the resist.

11. The manufacturing method of the semiconductor device according to claim 10, further comprising forming a gate insulating film on an entire portion of surfaces of the nano wires, forming a gate electrode material on the gate insulating film, and making flat the gate electrode material layer and removing part of the gate electrode material.

* * * * *